US012216150B2

(12) United States Patent
Subbareddy et al.

(10) Patent No.: US 12,216,150 B2
(45) Date of Patent: Feb. 4, 2025

(54) ON-DIE AGING MEASUREMENTS FOR DYNAMIC TIMING MODELING

(71) Applicant: Intel Corporation, Santa Clara, CA (US)

(72) Inventors: Dheeraj Subbareddy, Portland, OR (US); Ankireddy Nalamalpu, Portland, OR (US); Mahesh A. Iyer, Fremont, CA (US); Dhananjay Raghavan, Portland, OR (US)

(73) Assignee: Altera Corporation, San Jose, CA (US)

( * ) Notice: Subject to any disclaimer, the term of this patent is extended or adjusted under 35 U.S.C. 154(b) by 222 days.

(21) Appl. No.: 18/086,616

(22) Filed: Dec. 21, 2022

(65) Prior Publication Data

US 2023/0129176 A1   Apr. 27, 2023

Related U.S. Application Data

(62) Division of application No. 16/232,023, filed on Dec. 25, 2018, now Pat. No. 11,609,262.

(51) Int. Cl.
*G01R 31/26* (2020.01)
*G01R 31/28* (2006.01)
(Continued)

(52) U.S. Cl.
CPC ..... *G01R 31/2642* (2013.01); *G01R 31/2856* (2013.01); *G01R 31/2882* (2013.01);
(Continued)

(58) Field of Classification Search
CPC ........... G01R 31/2642; G01R 31/2856; G01R 31/2882; G01R 31/3016; G01R 31/31707;
(Continued)

(56) References Cited

U.S. PATENT DOCUMENTS 7,005,871 B1 * 2/2006 Davies ................. G01R 31/287
345/519
7,183,799 B1   2/2007 Donlin et al.
(Continued)

OTHER PUBLICATIONS

M. Bhushan et. al, "Ring oscillators for CMOS process tuning and variability control," IEEE Transactions on Semiconductor Manufacturing 2006, vol. 19, Issue 1. pp 10-18.

*Primary Examiner* — Nghia M Doan
(74) *Attorney, Agent, or Firm* — InventIQ Legal LLP

(57) ABSTRACT

A method includes mapping an aging measurement circuit (AMC) into the core fabric of an FPGA and operating the AMC for a select time period. During the select period of time, the AMC counts transition of a signal propagating through the AMC. Timing information based on the counted transitions is stored in a timing model in a memory. The timing information represents an aging characteristic of the core fabric at a time that the AMC is operated. An EDA toolchain uses the timing information in the timing model to generate a timing guard-band for the configurable IC die. The AMC is removed from the core fabric and another circuit device is mapped and fitted into the core fabric using the generated timing guard-band models. The circuit device is operated in the configurable IC die based on the timing guard-band models.

20 Claims, 18 Drawing Sheets

(51) Int. Cl.
   *G01R 31/30*      (2006.01)
   *G01R 31/317*     (2006.01)
   *G01R 31/3185*    (2006.01)
   *G01R 31/3193*    (2006.01)

(52) U.S. Cl.
   CPC ... *G01R 31/3016* (2013.01); *G01R 31/31707* (2013.01); *G01R 31/31725* (2013.01); *G01R 31/318516* (2013.01); *G01R 31/31937* (2013.01)

(58) Field of Classification Search
   CPC ...... G01R 31/31725; G01R 31/318516; G01R 31/31937
   See application file for complete search history.

(56) References Cited

U.S. PATENT DOCUMENTS

| | | | | |
|---|---|---|---|---|
| 7,531,836 | B2 * | 5/2009 | Liu | G01R 31/2642 |
| | | | | 257/299 |
| 9,484,892 | B1 * | 11/2016 | Kakoee | H03K 3/011 |
| 9,714,966 | B2 * | 7/2017 | Chen | G01R 31/2884 |
| 11,609,262 | B2 * | 3/2023 | Subbareddy | G01R 31/31937 |

* cited by examiner

ON-DIE AGING MEASUREMENTS FOR DYNAMIC TIMING MODELING

CROSS REFERENCE TO RELATED APPLICATION

This patent application is a divisional of U.S. patent application Ser. No. 16/232,023, filed Dec. 25, 2018, which is incorporated by reference herein in its entirety.

FIELD OF THE DISCLOSURE

The present disclosure relates to a configurable integrated circuit die that is usable with a host computing system. More specifically, the present disclosure relates to a configurable integrated circuit die that includes an aging measurement circuit that measures aging characteristics of the die as the die ages from use.

BACKGROUND OF THE INVENTION

Configurable integrated circuit dies may be configured to implement one or more circuit devices. As a circuit device is operated on the die, the die ages. Die aging is detectable from the degradation in the performance of the die over time. Device aging may include degradation of various circuit elements on a die, such as the transistors, resistors, capacitors, metal races, and other circuit elements. Device aging may result from the affects of thermal expansions and contractions, electromigration, and oxidation of metals and dielectrics. These device-aging mechanisms often cause dies to operate slower over time.

Device guard-banding is often used to compensate for device aging. A die that is intended to operate for a given number of years may be guard-banded based on the given number of years. However, prior to the number of years having passed, the guard-band may be excessive. An excessive guard-band may inhibit a die from being used at a potentially high clock speed, from being used at a desired low voltage setting, from being used at a desired low power setting, or any combination of these settings.

Thus, an impetus exists to determine aging characteristics of a die based on current device aging as compared to the device aging for the given number of years that the device is intended for use. A further impetus exists to use the current determined aging characteristics to generate and use guard-bands for die based on the currently determined aging characteristics.

DETAILED DESCRIPTION

Figure 1:
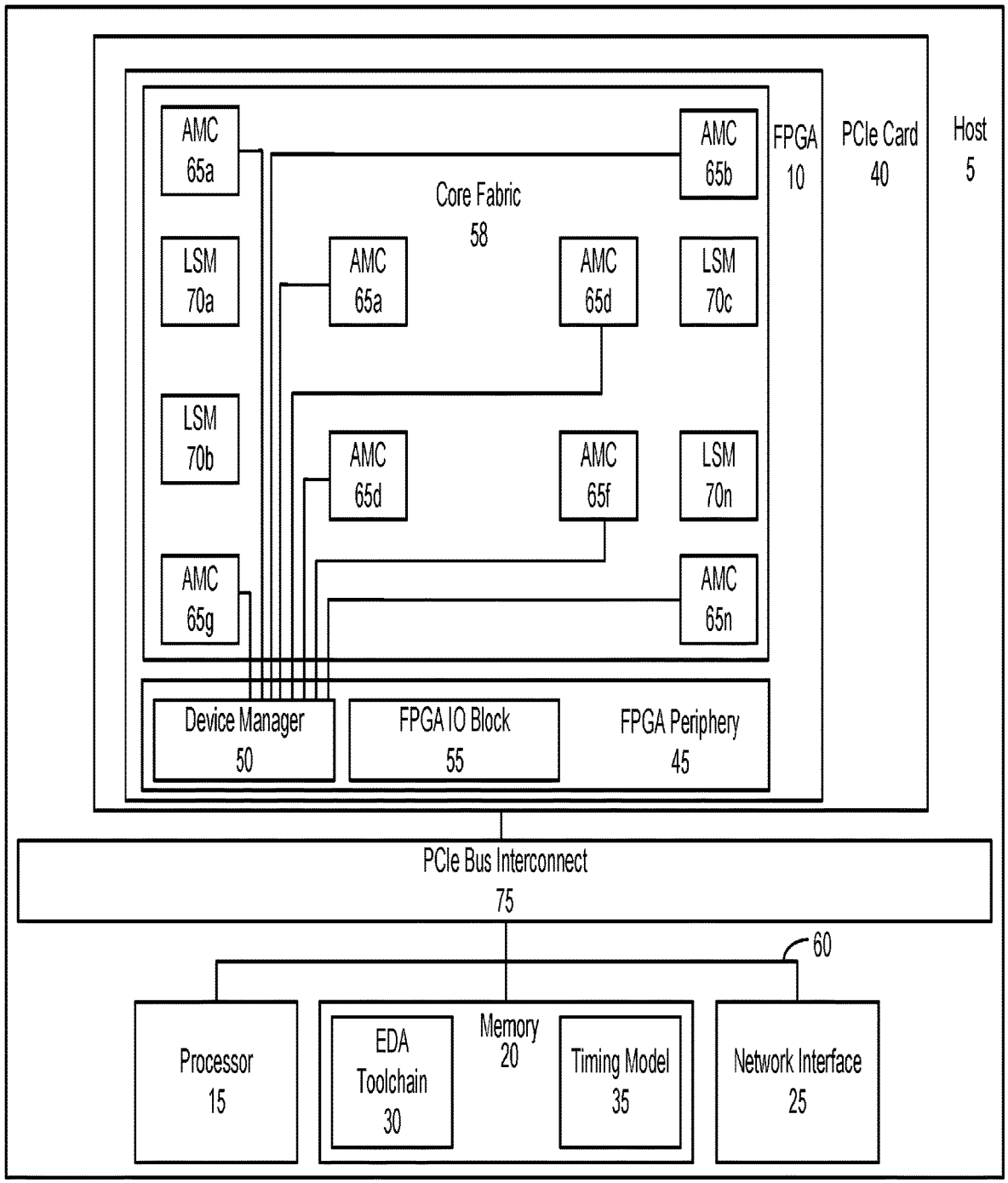
FIG. 1 illustrates a host that includes a PCIe card where the card has a configurable IC die mounted on the card and the configurable IC die includes an aging measurement circuit (AMC) in a core fabric of the die, in an embodiment.

Configurable integrated circuit (IC) dies that are often packaged discretely and as system-in-package (SiP) devices continue to fuel development in IC markets. Circuit emulation markets, ASIC prototyping markets, and data center markets are a few of the developing IC markets fueled by configurable IC dies. Configurable IC dies directed toward circuit emulation markets often include several configurable IC dies packaged as a SiP to facilitate an almost unlimited number of emulated circuits where a single configurable IC die may be unable to supply sufficient programmable fabric for implementing an emulation circuit. Configurable IC dies directed toward ASIC prototyping markets often include a number of configurable ICs dies packaged as a SiP to implement a variety of ASICs. Configurable IC dies directed toward data center markets are often discretely packaged or packaged as SiPs to facilitate ASIC functions in the data center, acceleration in the data center, to add processing capability, to add network and virtual network capability, to add non-volatile memory express capability, or other capabilities.

Configurable IC dies directed toward these markets and other markets may include field programmable gate arrays (FPGAs), programmable logic devices (PLDs), complex programmable logic devices (CPLDs), programmable logic arrays (PLAs), configurable logic arrays (CLAs), memory, transfer dies, and other ICs. Configurable IC dies typically include a number of configurable logic blocks that may be configured to implement various circuits. The logic blocks are interconnected by configurable interconnect structures that may be configured to interconnect the logic blocks in almost any desired configuration to provide almost any desired circuit.

At the time a circuit device is mapped into a configurable IC die, timing models are applied to the circuit device and the mapping. Currently, the timing models may include timing guard-bands that provide that the circuit device will operate appropriately for the intended lifetime of the configurable IC die. The timing guard-bands may be developed for a given number of years that the configurable IC die is anticipated to be used. These timing guard-bands are sometimes referred to as upfront guard-bands. Such timing models and upfront guard-bands may be appropriate for configurable IC dies that are configured once and thereafter put into use. However, such timing models are generally pessimistic and penalize configurable IC die performance, efficiency, or both in the time prior to the end of the given number of years that the configurable IC die is anticipated to be used.

Performance may be penalized, for example, if the timing guard-band limits the maximum operating frequency or the operating voltage is raised to that so that the maximum operating frequency is raised. Limiting the maximum operating frequency limits absolute performance and raising operating voltage lowers performance efficiency. Penalizing the maximum frequency that a configurable IC die may operate at a given voltage penalizes the maximum frequency without a power consumption penalty. A higher operating voltage has a relatively large power consumption penalty because the static component of power consumption increases exponentially with voltage. A higher operating voltage penalizes the performance/Watt metric, which is an indicator of efficiency.

Upfront guard-banding is typically applied uniformly across the entirety of the core fabric of a configurable IC die and the hardened peripheral circuitry of a die. Therefore, all of the circuits of the configurable IC die will be uniformly and pessimistically penalized. If different portions of a configurable IC die experience different aging characteristics, uniformly applying upfront guard-banding is not able to compensate for the different aging characteristics.

Embodiments described herein are directed toward the generation of timing guard-banding based on current aging characteristics for emerging usages of configurable IC dies, such as in data centers. In data centers, configurable IC dies are often re-programmed to meet the needs of a variety of cloud customers and software developers. Each circuit device mapped into a configurable IC die may be operable for a period of time that is relatively small compared to the anticipated lifetime of the die. Using traditional upfront guard-banding applies a performance penalty, an efficiency penalty, or both to every circuit device mapped into a configurable IC die for the lifetime of the die. A timing guard-band based on current aging characteristics may remove these penalties.

FIG. 1 illustrates a host 5 that includes a configurable IC die 10, in an embodiment. The host may also include a processor 15, a memory 20, a network interface card (NIC) 25, an electronic design automation (EDA) toolchain 30, a timing model 35, other components, or any combination of these components. The configurable IC die 10 may be mounted on a plugin card 40 (e.g., a PCIe card) that may be plugged into a card slot of the host.

The configurable IC die 10 includes a core fabric 40 and a periphery 45. The core fabric may be user configurable for implementing one or more circuit devices in the fabric. The circuit devices may be operable in a data center or other environment and may include an accelerator, a network interface card, a non-volatile memory express controller, an application specific circuit (ASIC), or other devices.

Elements in the periphery may include hardened elements, such as hardened circuit elements. The periphery may include a device manager 50, an IO block 55, other circuits, or any combination of these elements. In some embodiments, the device manager or portions of the device manager are located in the core fabric. The periphery, the core fabric, or both may include a number of local sector managers (LSMs) 70a, 70b, 70c . . . 70n.

Processor 15, memory 20, and NIC 25 may be connected by a bus 60. The bus may connect to an interconnect 75 (e.g., a PCIe interconnect). The processor may connected to the 10 block of the configurable IC die via bus 60 and interconnect 75.

The plugin card 40, configurable IC die 10, or both may operate according to a PCIe protocol or other protocol. For example, the device manager and any circuit device operating on the configurable IC die may be a PCIe device and may be associated with one or more PCIe functions that expose the device manager or circuit devices to a host operating of a host that the PCIe card is connected to. In an embodiment, the device manager 50 may communicate with the host platform using a serial management interface (SMI) protocol or an Inter-Integrated Circuit (I2C) bus protocol.

Memory 20 may include a FLASH memory or other type of memory device. The memory may be connected to 10 block of the configurable IC die via bus 60 and interconnect 75. The memory may be connected to the processor and supply instructions, information, or both to the processor, the configurable IC die, or both of these components.

The memory may be adapted to store one or more drivers for the EDA toolchain and may be adapted to store the timing model. The EDA toolchain includes programmable logic device design software. The EDA toolchain may enable analysis and synthesis of hardware description language (e.g., HDL, VHDL, or other languages) circuit designs. The EDA toolchain enables a developer to compile circuit designs for mapping and fitting the circuit design into the core fabric of the configurable IC die 10. The EDA toolchain may use timing model 35 to perform timing analysis and generate timing guard-bands for a circuit design. The timing models may include software, timing information, lookup tables, or other information that may be used by the EDA toolchain for performing timing analysis, circuit optimization, physical optimization, and generating a timing guard-band for a circuit design.

The EDA toolchain may also examine register-transfer level (RTL) diagrams, simulate the reaction of a circuit design to different inputs, and configure the configurable IC die with the circuit device. The EDA toolchain may include the Quartus® toolbox (e.g., Quartus® II toolbox) or may include a subset of drivers of the Quartus® toolbox (e.g., Quartus® II toolbox).

In an embodiment, the timing model includes timing information for one or more aging characteristics of the configurable IC die. The aging characteristics may include the slowing of one or more wires that link the circuits in a LAB or that link LABs, the slowing of the circuits in the LABs, or any combination of these components. The timing information may quantify the slowing of the operation of the wires and circuits.

The wires and circuits may age due to thermal expansions and contractions that effect the mechanical and electrical properties of these elements, due to electromigration, and due to oxidation of dielectrics, metal lines, or other materials. The aging of wires, circuits, or both components slows these components operations. The timing information may be collected from one or more wire and circuit in a configurable IC die.

The core fabric may include one or more aging measurement circuits (AMCs), such as AMCs 65a, 65b . . . 65n that generate the timing information. The AMCs may be distributed across a number of locations in the core fabric. For example, the AMCs may be located in corners of the core fabric, in central locations of the core fabric, along sides of the core fabric, randomly located in the core fabric, in any combination of these locations, or in other locations. An AMC may be located in one logic array blocks (LAB) or may be distributed across a number of LABs.

Each AMC is adapted to determine one or more aging characteristics of the circuits, wires, one of these, or both of these in the core fabric, periphery, or both. Each AMC may include one or more circuits that determine one or more aging characteristics of the configurable IC die. Various AMC embodiments are described below.

The AMCs may be operated under control the device manager 50, the LSMs 70a . . . 70n, or both. Specifically, the device driver for the EDA toolchain may enable access of the EDA toolchain to the bus (e.g., I2C bus, PCIe bus, or other bus types) for further access to the device manager and LSMs. The device driver may issue an aging query over the bus to the device manager. The device manager may send the aging query to one or more of the LSMs to operate the AMCs to generate timing information for an aging characteristic. Timing information generated by the AMCs may be transmitted to the LSMs for further transfer to the device manager. The device manager may transmit the timing information to the device driver for the EDA toolchain for storage in the timing model. The timing information may be associated with a time and date for the time and date when the timing information is generated. The time and date may be stored in the timing model. The time and date information may be associated with the timing information in the timing model.

The timing information for the aging characteristic may be associated with location information for locations in the configurable IC where the timing information is generated. The location information may include die co-ordinates (e.g., Cartesian type coordinates), LAB location, a LAB identifier, or other location information (e.g., upper left corner, upper right corner, lower right corner, lower left corner, left central location, right central location, etc.). The location information may be stored in the timing model and may be associated with the timing information in the timing model. In an embodiment, the timing information is not associated with die coordinates or other location information.

In an embodiment, the device driver for the EDA toolchain may associate the timing information for the aging characteristic with a specific configurable IC die in the timing model. For example, the timing information may be associated with identifiers (e.g., a serial numbers) for the dies for which the timing information is generated. Timing models for a number of configurable IC dies that are associated with specific configurable IC dies may be collected by a central server. The timing models may be used by a manufacturer, for example, to determine trends in aging characteristics, which may be used for process improvements, mapping improvements, or other improvements to configurable IC dies.

In an embodiment, the device manager may operate the AMCs according to a stored schedule that the device manager accesses and uses for operating the AMCs. The schedule may specify that the AMCs are to be operated on daily, monthly, every two months, every three months, every four months, every five months, every six months, every year, or at other intervals. The schedule may specify that the AMCs be operated when the host is rebooted from a power down. The schedule may specify that the AMCs be operated when the core fabric of the configurable IC die is configured to switch from operation of a first circuit device in the core fabric to second circuit device in the core fabric.

Alternatively, the device manager may operate the AMCs when a circuit device is mapped into the core fabric. For example, a first user of a data center may use the configurable IC die with a first circuit device in the core fabric. A second customer may schedule use of the data center with a second circuit device mapped into the core fabric of the configurable IC die. Before the second circuit device is mapped into the core fabric, the device manager may operate the AMCs so that the timing information for an aging characteristic of the configurable IC die is measured. The device manager may receive the timing information for the aging characteristics from the AMCs and may transfer the timing information to the timing model for storage and later use.

In an embodiment, one or more AMCs are mapped into the core fabric and operated before the second circuit device is mapped into the core fabric. Thereafter, the AMCs may be removed from the core fabric before the second circuit device is mapped into the core fabric of the die. Mapping the AMCs into the core fabric and removing the AMCs prior to the second circuit device being mapped into the core fabric provides that the EDA toolchain is not prevented from placing the second circuit device in the one or more LABs that might otherwise be occupied by AMCs. Additionally, the EDA toolchain may be able to use the most recently collected timing information to generate the timing guard-bands for the second circuit device. Therefore, the second circuit device will not use timing guard-bands that are larger than the timing guard-bands that are generated from the most recently collected timing information.

In one embodiment, the locations of the AMCs in the core fabric are associated with the timing information that the AMCs generate. For example, if an AMC is located at a top left corner of the core fabric, then the timing information that is generated by this AMC is associated with the top left corner of the core fabric. The timing information for one location (e.g., the top left corner) in the core fabric may not be associated with other locations in the core fabric (e.g., not associated with a bottom left corner, a central location, or other locations). The association between the timing information and the location information may be stored in the timing model.

The EDA toolchain may use the timing information to generate one or more timing guard-band for the circuit device. A single timing guard-band may be generated and applied to the entire configurable IC die or several timing guard-bands may be generated and applied to different regions of the configurable IC die, such as different regions of the core fabric where the circuit device is mapped to. For example, if a user constrains the configurable IC die to use 10 pins in a specific region of the configurable IC die, the EDA toolchain may use a timing guard-band for the specific region in the core fabric where the circuit device is mapped to. The timing guard-band for the specific region of the configurable IC die may not be used for other regions of the configurable IC die.

In an embodiment, the EDA toolchain may be adapted to use the timing information to logically map and physically fit a circuit device into the core fabric. Specifically, the EDA toolchain may be adapted to use the timing information in combination with the location information associated with the timing information for mapping and fitting a circuit device into the core fabric. The EDA toolchain may place a constraint on the mapping and fitting based on the timing information used in combination with the location information. For example, if the timing information indicates that the top left corner of the core fabric has one or more aging characteristics that exceed the aging characteristics of other locations of the core fabric, the EDA toolchain may place one or more constraints on the mapping and fitting based on the timing information and location information. An aging characteristic of a first location of a core fabric may exceed an aging characteristic of a second location of the core fabric if the circuits or wires of the first locations are slower than the circuits and wires of the second location. The EDA toolchain may place a low priority or no priority for mapping and fitting portions of a circuit device to a portion (e.g., top left corner) of the core fabric having a relatively large aging characteristic.

A first portion of the core fabric may have a relatively large aging characteristic compared to a second portion of the core fabric if a circuit device has operated at the first portion for a relatively long time or has been extensively operated. The first location may operate slower for example if the first location has been used more than other portions of the core fabric. For example, if a first circuit was mapped into the top left corner of the core fabric, then this corner of the core fabric may have a larger aging characteristic compared to other portions of the core fabric. A portion of a core fabric may also have a larger aging characteristic based on the function of the type of circuit in the portion of the core fabric, based on the switching activity of the circuit in the portion of the core fabric, or both.

Figure 2:
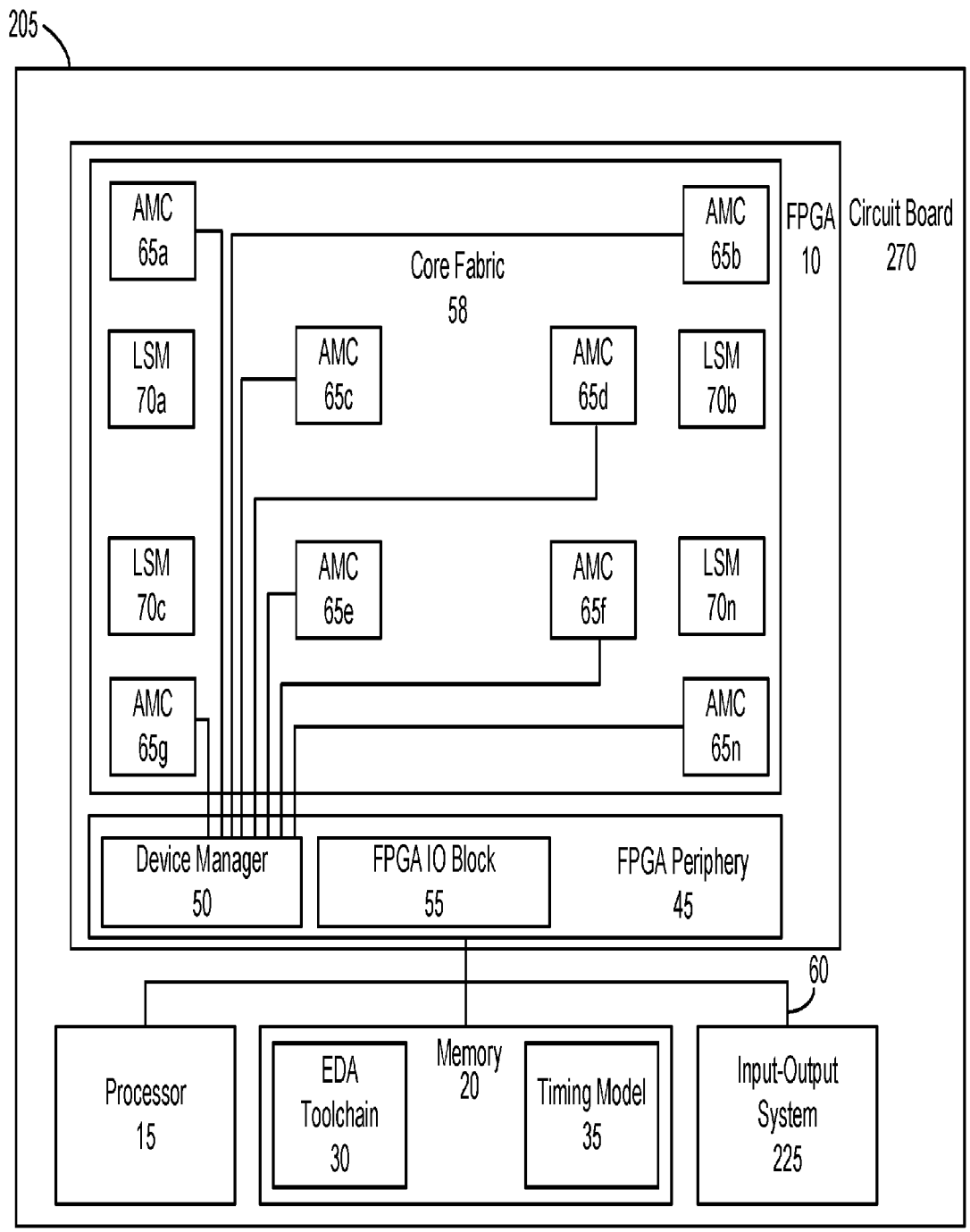
FIG. 2 illustrates a SiP that includes a configurable IC die where the die includes an AMC in a core fabric of the die, in an embodiment.

FIG. 2 illustrates a SiP 205, in an embodiment. The SiP may include configurable IC die 10, processor 15, memory subsystem 20, an IO subsystem 225, EDA toolchain 30, timing model 35, a package substrate 270, other components, or any combination of these components. Configurable IC die 10 includes AMCs 65a . . . 65n. While configurable IC die 10 is shown as including a number of AMCs, the configurable IC die may include one or more AMCs. SiP 205, configurable IC die 10, and the AMCs may be adapted to operate similarly to host 5 described above to determine an aging characteristic and timing information for the aging characteristic for the configurable IC die.

The configurable IC die, processor, memory subsystem, and IO subsystem may be mounted on package substrate 270. Package substrate 270 may include a printed circuit board formed of an FR4 material or other circuit board material. The processor, memory subsystem, IO subsystem, and configurable IC die may be adapted to communicate via traces in the substrate and may be adapted to communicate via a die-to-die communication protocol.

The SiP may be adapted to be mounted on an insert card, such as a PCIe card, in a host, or other systems. The SiP may be adapted for use in a data center or in other applications. The processor may execute instructions of a device driver of the EDA toolchain. The processor may communicate with the device manager to initiate operation of the AMCs so that the AMCs generate timing information for the aging characteristics of the configurable IC die. The timing information may be stored in the timing model. The EDA toolchain may be adapted to use the timing information for generating timing guard-bands, for mapping and fitting a circuit device into the core fabric of the configurable IC die, or for other purposes.

In an embodiment, the timing information may be transferred from the SiP to a host or another computer system that the SiP is mounted in. The host or another computer system may generate the timing guard-bands for the configurable IC die for mapping and fitting a circuit device optimally into the core fabric. The host or another computer system may operate one or more drivers of the EDA toolchain to generate the timing guard-bands, optimally map and fit a circuit device into the core fabric, or for other purposes. The host or another computer system may store and operate one or more drivers of the EDA toolchain as described above.

In an embodiment, a host and the SiP operate in combination to generate the timing guard-bands, optimally map and fit a circuit device into the configurable IC die, or both. The host, SiP, or both may store and operate drivers for the EDA toolchain for generating the timing guard-bands, for mapping and fitting a circuit in the core fabric, or both.

Figure 3:
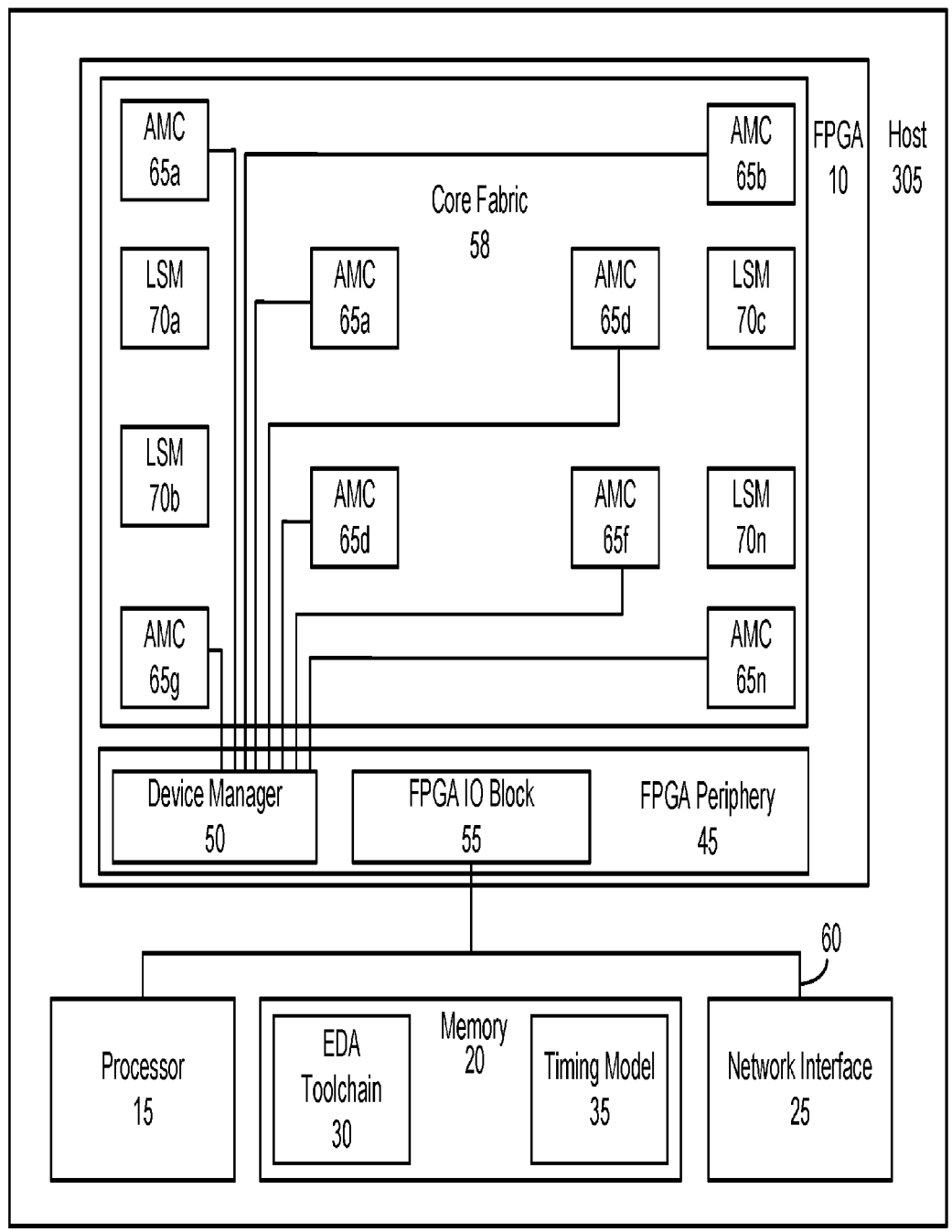
FIG. 3 illustrates a host that includes a configurable IC die where the die includes an aging measurement circuit in a core fabric of the die, in an embodiment.

FIG. 3 illustrates a host 305 that includes a configurable IC die 10, in an embodiment. Host 305 is similar to host 5 described above, but differs in that configurable IC die 10 mounted on a PCB of the host or in a socket of the host. The configurable IC die may not be mounted on an insert card, such as a PCIe card.

Host 305 may include configurable IC die 10, processor 15, memory subsystem 20, network interface 25, EDA toolchain 30, timing model 35, other components, or any combination of these components. The configurable IC die of host 305 may be packaged discretely in an IC package, packaged in a SiP, packaged in a multi-chip module (MCM), or packaged in another package.

Configurable IC die 10 includes AMCs 65a . . . 65n. While Configurable IC die 10 is shown as including a number of AMCs, the configurable IC die may include one or more AMCs. Host 305, configurable IC die 10, and the AMCs may be adapted to operate similarly to host 5 described above to determine an aging characteristic and timing information for the aging characteristic for the configurable IC die.

Figure 4:
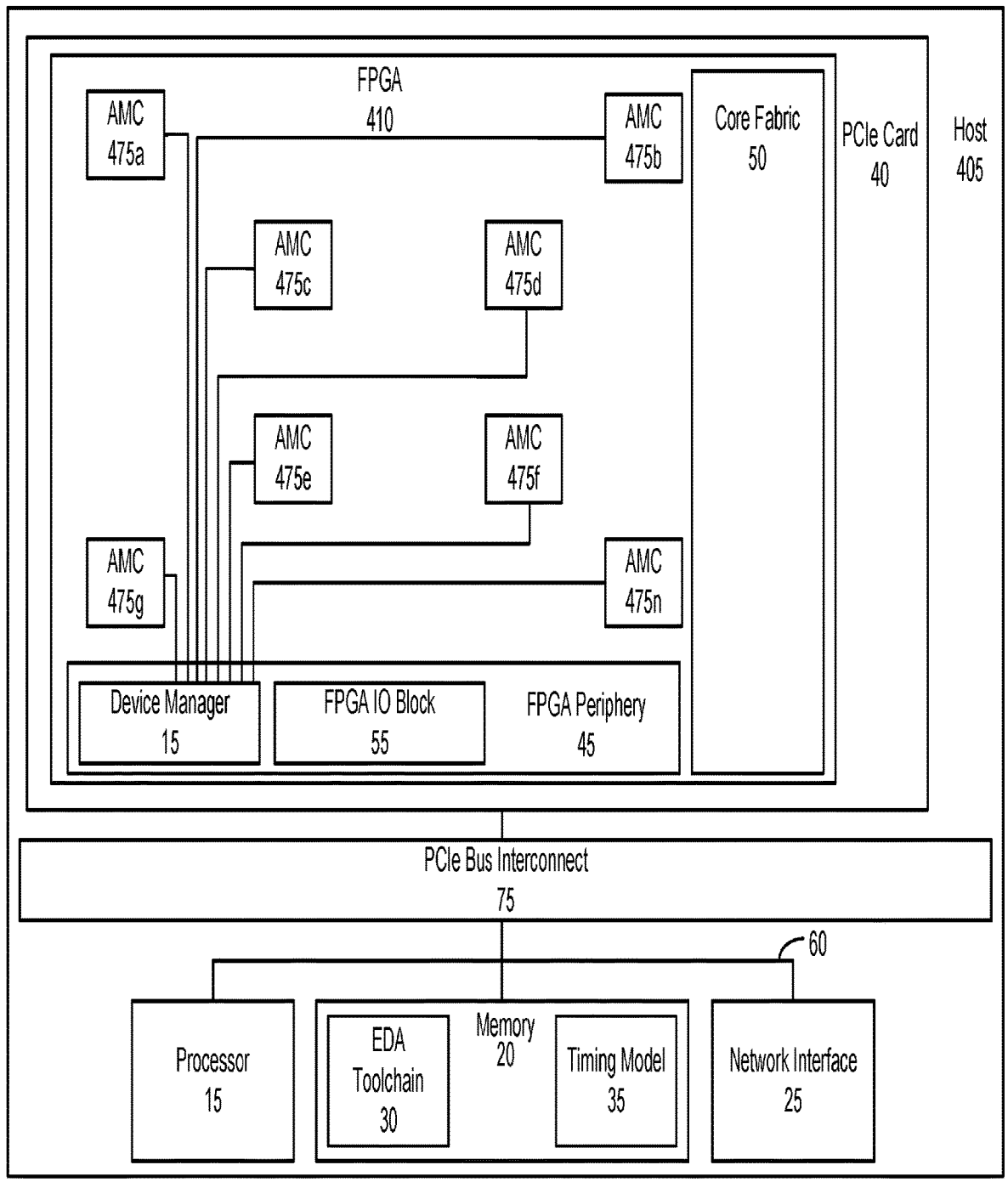
FIG. 4 illustrates a host that includes a PCIe card where the card has a configurable IC die mounted on the card and the die includes a hardened AMC, in an embodiment.

FIG. 4 illustrates a host 405 that includes a configurable IC die 410, in an embodiment. The configurable IC die may be mounted on a PCIe card 40 that is inserted into card slot 70 of the host. Host 405 may be similar to host 5 described above, but differs in that configurable IC die 410 includes AMCs 475a . . . 475n that are hardened circuits. That is, AMCs 475a . . . 475n are not in the core fabric 50 of the configurable IC die. While FIG. 4 shows that configurable IC die 410 includes a number of AMCs, the die may include one or more AMCs. The AMCs may be connected to device manager 15, which is adapted to operate the AMCs for making timing measurement for determining timing information for the aging characteristic of the configurable IC die. The timing information may be stored in the timing model for use in generating timing guard-bands, for mapping and fitting circuit devices into the core fabric, or for other purposes.

Figure 5:
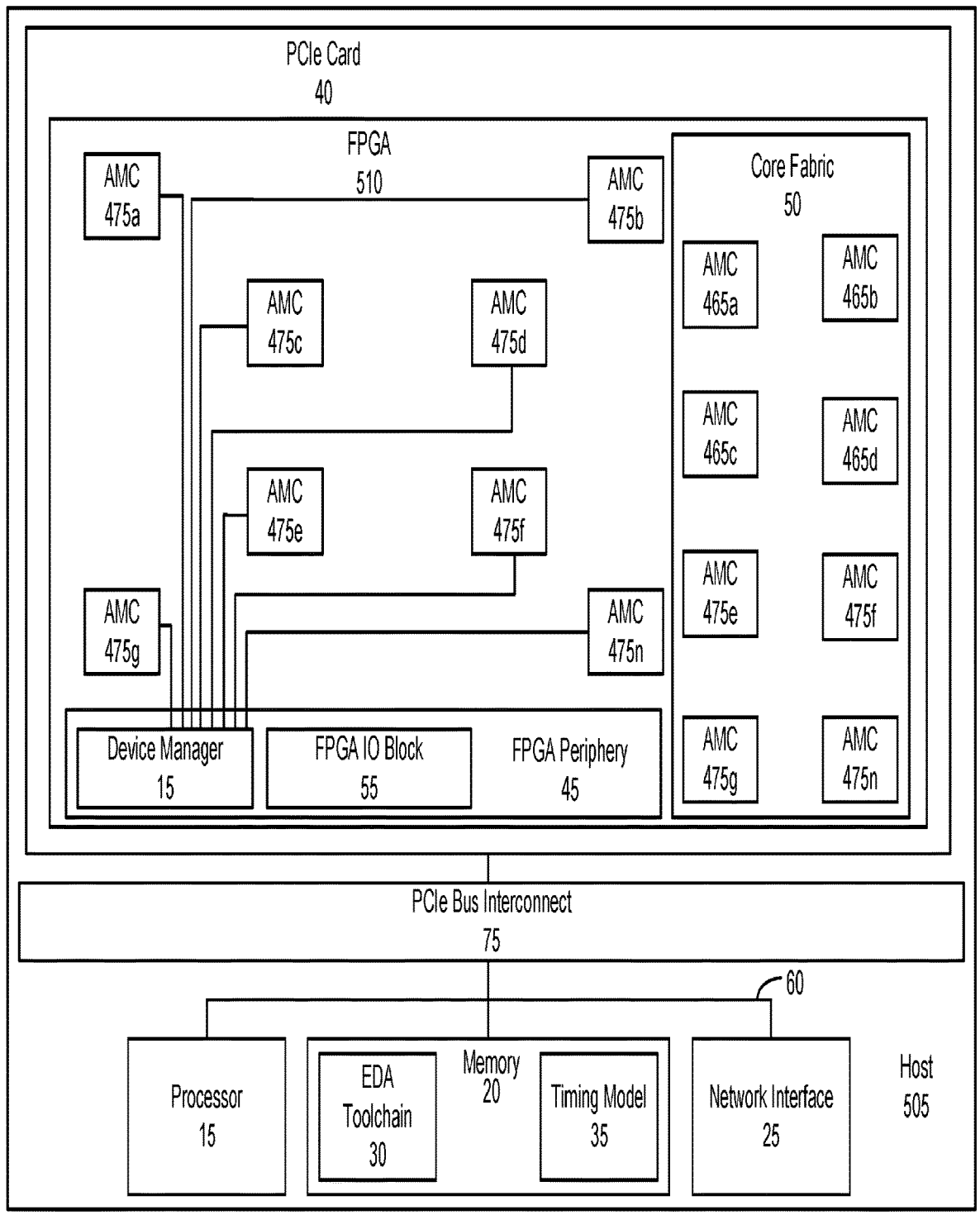
FIG. 5 illustrates a host that includes a configurable IC die where the die includes soft and hardened AMCs, in an embodiment.

FIG. 5 illustrates a host 505 that includes a configurable IC die 510, in an embodiment. Host 505 and configurable IC die 510 are similar to host 405 and configurable IC die 405, but differ in that configurable IC die 505 includes first AMCs 475a . . . 475n that are hardened circuits and a second AMCs 465a . . . 465n that are soft circuits in the core fabric 50. While FIG. 5 shows that configurable IC die includes a number of hardened AMCs 475a . . . 475n, the configurable IC die may include one or more hardened AMCs. Further, while FIG. 5 shows that configurable IC die includes a number of soft AMCs 465a . . . 465n, the configurable IC die may include one or more soft AMCs. Soft AMCs 465a . . . 465n may be mapped into the core fabric at a time when aging characteristics are to be collected and removed from the core fabric after the aging characteristics are collected.

Host 505 may be adapted to operate similarly to host 5 described above. The hardened and soft AMCs may be operated at approximately the same time or at different times by the device manager under operation of the device driver of the EDA toolchain. When the hardened and soft AMCs are operated at different times, the timing information generated by the AMCs may be associated with different operating times in the timing model. When the hardened and soft AMCs are operated at the same time, the timing information generated by the AMCs may be associated with same operating times in the timing model.

The location information for the AMCs that is stored in the timing model may include location information that distinguishes the hardened AMCs from the soft AMCs. Thereby, the timing information for that aging characteristics generated by the hardened AMCs may be distinguished from the timing information for that aging characteristics generated by the soft AMCs of the core fabric. The EDA toolchain may be adapted to use the different timing information for generating first timing guard-bands for the periphery of the configurable IC die and second timing guard-bands for the core fabric. In one embodiment, the first and second timing guard-bands may be different timing guard-bands. In another embodiment, the first and second timing guard-bands may be the same timing guard-bands.

Figure 6:
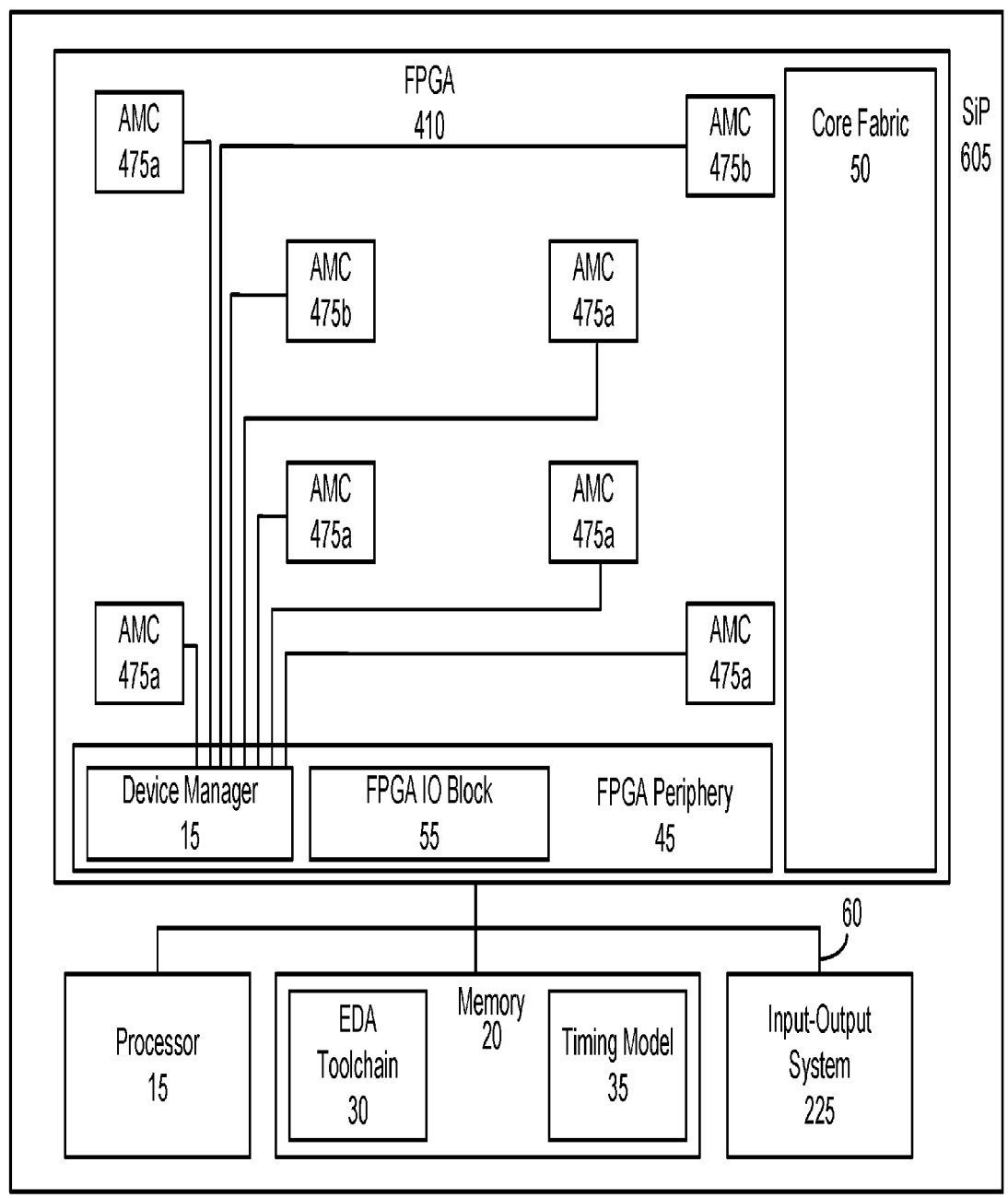
FIG. 6 illustrates a SiP that includes a configurable IC die wherein the die includes hardened AMCs, in an embodiment.

FIG. 6 illustrates a SiP 605 that includes a configurable IC die 610, in an embodiment. SiP 205 and SiP 605 are similar, but differ in that configurable IC die 605 includes first AMCs 475a . . . 475n that are hardened circuits. The hardened AMCs are not in the core fabric. The configurable IC die may include second AMCs that are soft AMCs located in the core fabric. SiP 605 may be adapted to operate similarly to SiP 205, SiP 505, and various configurable IC dies, and host systems described above.

Figure 7:
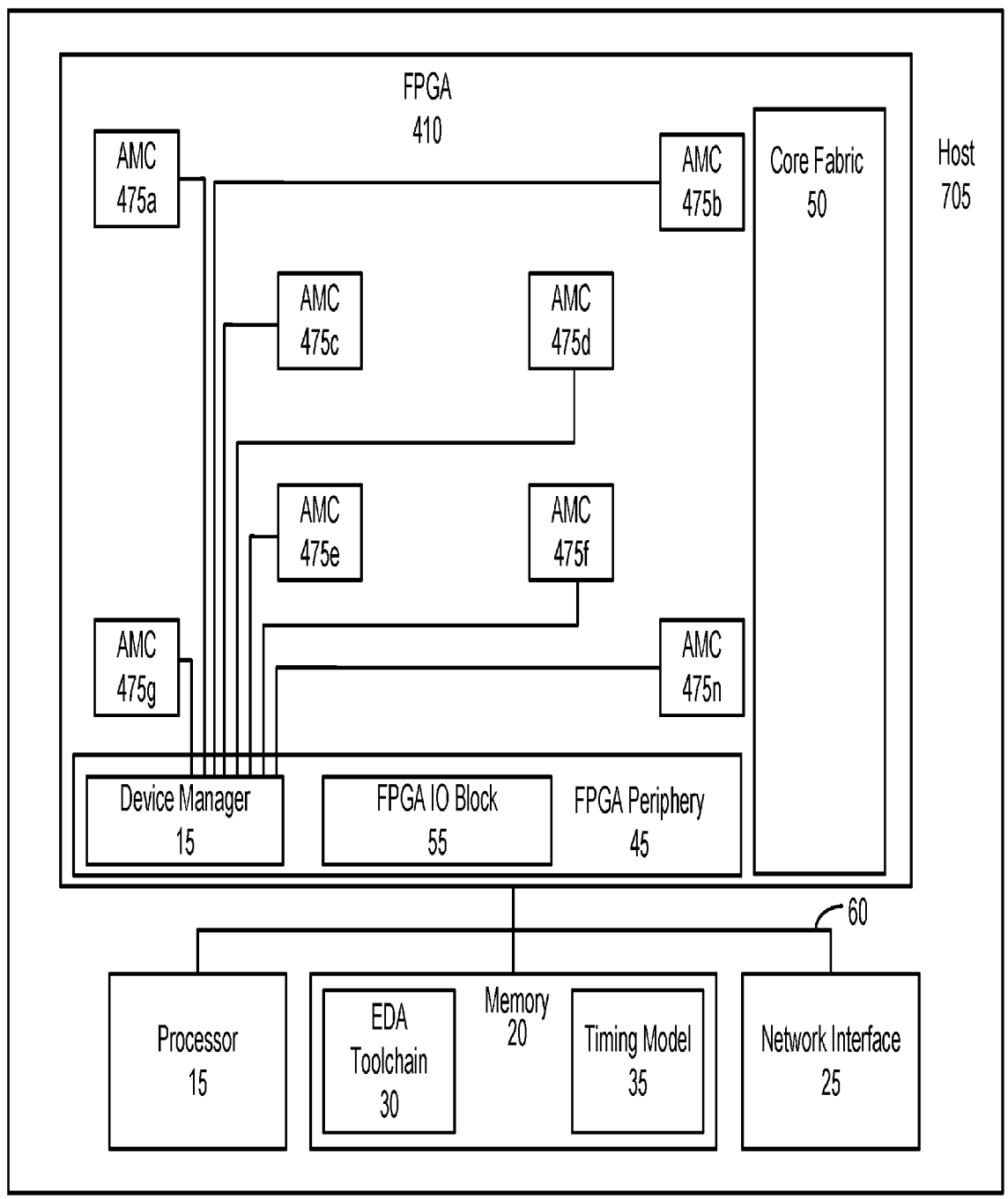
FIG. 7 illustrates a host that includes a configurable IC die where the die includes a hardened AMC, in an embodiment.

FIG. 7 illustrates a host 705 that includes configurable IC die 410, in an embodiment, in an embodiment. Configurable IC die 410 may be mounted on a PCB of host 705 or may be mounted in a socket in the host. In an embodiment, the die is not mounted on a plugin card. The AMCs 475a . . . 475n of configurable IC die 410 are hardened AMCs. While FIG. 7 shows that configurable IC die 410 includes a number of AMCs, the configurable IC die may include one or more AMCs. The configurable IC die may include second AMCs that are soft AMCs located in the core fabric. Host 705 may also be adapted to operate similarly to host 405, host 505, or other host systems, and SiPs described above.

The described configurable IC dies and soft AMCs allow for a number of benefits. Because the AMCs may be mapped into a configurable IC die before use and removed from the AMCs after use, the AMCs do not permanently consume space on the die. That is, the AMCs beneficially use the configurable nature of configurable IC dies, such as FPGAs, to facilitate the determination of aging characteristics when desired and removal of the AMCs from the configurable IC die when the AMCs are not in use. Times of desired use may include times when a host is scheduled for maintenance, during idle times between workloads operating in a data center, or at other times. Additionally, because the AMCs are located in the core fabric, the AMCs may measure areas of the core fabric where previous circuit devices have operated. Thereby, the EDA toolchain may use the determined timing information for aging characteristics to map and fit circuit devices into the core fabric and avoid placement in areas that may have relatively extensive or relatively large aging characteristics. Also, the EDA toolchain may use the determined timing information to generate timing guard-bands that allow for relatively high operating speeds, such as relatively high operating frequencies or other relatively high-speed operating characteristic.

The described configurable IC dies, and hardened AMCs allow for other benefits. The AMCs allow for use at essentially any time without configuring a configurable IC die with the AMCs and later removing the AMCs. Thereby, the AMCs may be operated in relatively narrow time windows when a host is not otherwise being used and where reconfiguring the core fabric may not be desirable. Alternatively, the AMCs may be operated when a relatively light workload is operating on a configurable IC die and operation of the AMCs may not slow the operation of the workload or may slow operation of the workload by an acceptable amount.

Figure 8:
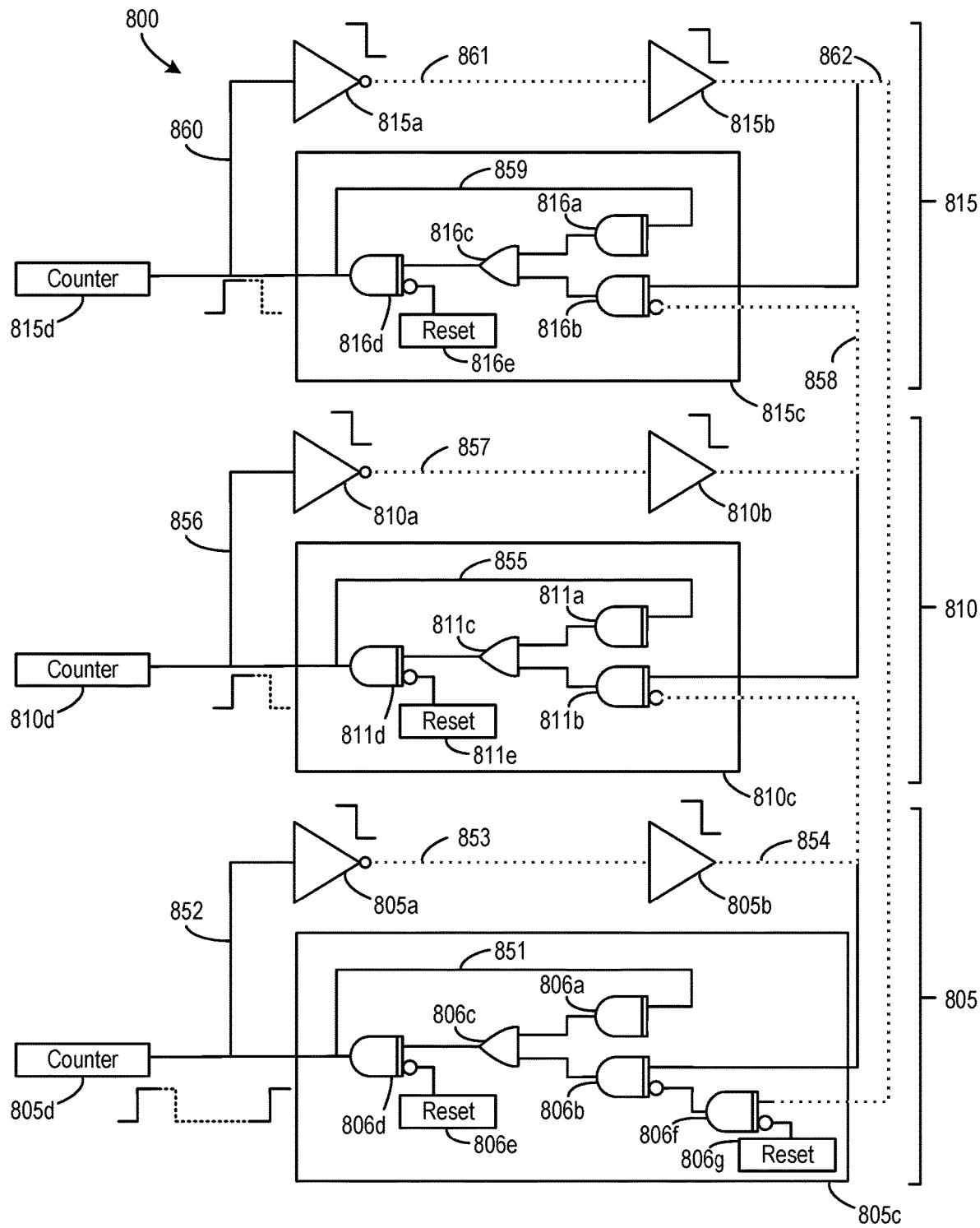
FIG. 8 illustrates an AMC that includes a ring oscillator, in an embodiment.

FIG. 8 illustrates an AMC 800, in an embodiment. AMC 800 is an example AMC that may be any one of the described AMCs in this patent, such as any of AMCs 65a . . . 65n, any of AMCs 475a . . . 475n, or other described AMCs. AMC 800 is a ring oscillator that includes an odd number of inverters, which may also be referred to as NOT gates.

The AMC may be located in adjacent adaptive logic elements (ALEs), which may be located in one or more logic array blocks (LABs). In an embodiment where the ALEs, which include AMC 800, are located in one LAB, the AMCs are adapted to measure signal delay (e.g., a timing characteristic associated with an aging characteristic) from local routing wires in the LAB, local circuits in the LAB, and other LAB timing characteristics. In an embodiment where the ALEs are located in more than one LAB, the AMC is adapted to measure a global-signal routing-delay characteristic. The global-signal routing-delay characteristic includes cumulative routing delay characteristics within each LAB and cumulative routing delay characteristics between the LABs.

In an embodiment, AMC 800 includes a first stage 805, a second stage 810, and a third stage 815. The first stage includes an inverter 805a, a buffer 805b, a control circuit 805c, and a counter (e.g., a shift register) 805d. The inverter 805a, buffer 805b, and control circuit 805c are arranged in a loop. The inverter is the head of the loop, the buffer is the tail of the loop, and the control circuit is the control of the loop.

In an embodiment, the control circuit 805c of the first stage includes an AND gate 806a, an AND gate 806b having a non-inverted input and one inverted input, an OR gate 806c, an AND gate 806d having a non-inverted input and an inverted input, which is connected to a reset circuit 806e, and an AND gate 806f having a non-inverted input and an inverted input, which is connected to a reset circuit 806g. An output of AND gate 806d feeds back into a first input of AND gate 806a. In an embodiment, a second input of AND gate 806a may be a fixed level input, e.g., 1 or 0. A first input (the non-inverted input) of AND gate 806b is connected to an output of buffer 805b. A second input (the inverted input) of AND gate 806b is connected to the output of AND gate 806f. A first input (the non-inverted input) of AND gate 806f is connected to the output of buffer 815b. A second input (the inverted input) of AND gate 806f is connected to reset 806g. The outputs of both AND gates 806a and 806b are connected to first and second inputs of OR gate 806c. The output of OR gate 806c is connected to a first input (the non-inverted input) of AND gate 806d. The reset 806e is connected to a second input (the inverted input) of AND gate 806d. An output of AND gate 806d is connected to both the input of counter 810d and the input of inverter 805a. An output of inverter 805a is connected to an input of buffer 805b. Counter 805d is adapted to accumulate (i.e., count) the signal transitions of stage one 805. The counter may count high-to-low signal transitions, low-to-high signal transitions, or both.

The second stage 810 includes an inverter 810a, a buffer 810b, a control circuit 810c, and a counter (e.g., a shift register) 810d. The inverter 810a, buffer 810b, and control circuit 810c are arranged in a loop. The inverter is the head of the loop, the buffer is the tail of the loop, and the control circuit is the control of the loop.

In an embodiment, the control circuit 810c of the second stage includes an AND gate 811a, an AND gate 811b having a non-inverted input and an inverted input, an OR gate 811c, and an AND gate 811d having a non-inverted input and an inverted input, which is connected to a reset circuit 811e. An output of AND gate 811d feeds back into a first input of AND gate 811a. In an embodiment, a second input of AND gate 811a may be a fixed level input, e.g., 1 or 0. A first input (the non-inverted input) of AND gate 811b is connected to an output of buffer 810b. A second input (the inverted input) of AND gate 811b is connected to the output of buffer 805b of the second stage. The outputs of both AND gates 811a and 811b are connected to first and second inputs of OR gate 811c. The output of OR gate 811c is connected to a first input (the non-inverted input) of AND gate 811d. The reset 811e is connected to a second input (the inverted input) of AND gate 811d. An output of AND gate 811d is connected to both the input of counter 810d and the input of inverter 810a. An output of inverter 810a is connected to an input of buffer 810b. Counter 810d is adapted to accumulate (i.e., count) the signal transitions of stage two 810. The counter may count high-to-low signal transitions, low-to-high signal transitions, or both.

The third stage 815 includes an inverter 815a, a buffer 815b, a control circuit 815c, and a counter (e.g., a shift register) 815d. The inverter 815a, buffer 815b, and control circuit 815c are arranged in a loop. The inverter is the head of the loop, the buffer is the tail of the loop, and the control circuit is the control of the loop.

In an embodiment, the control circuit 815c of the third stage includes an AND gate 816a, an AND gate 816b having a non-inverted input and an inverted input, an OR gate 816c, and an AND gate 816d having a non-inverted input and an inverted input, which is connected to a reset circuit 816e. An output of AND gate 816d feeds back into a first input of AND gate 816a. In an embodiment, a second input of AND gate 816a may be at a fixed level input, e.g., 1 or 0. A first input (the non-inverted input) of AND gate 816b is connected to an output of buffer 815b. A second input (the inverted input) of AND gate 816b is connected to the output of buffer 810b of the second stage. Outputs of both AND gates 816a and 816b are connected to first and second inputs of OR gate 816c. An output of OR gate 816c is connected to a first input (the non-inverted input) of AND gate 816d. The reset 816e is connected to a second input (the inverted input) of AND gate 816d. The output of AND gate 816d is connected to both the input of counter 815d and the input of inverter 815a. An output of inverter 815a is connected to an input of buffer 815c. Counter 815d is adapted to accumulate (i.e., count) the signal transitions of stage three 815. The counter may count high-to-low signal transitions, low-to-high signal transitions, or both. Reset 816e is adapted to reset the first stage of the ring oscillator.

The ring oscillator is sometimes referred to as a "fall" measurement circuit as the first inverter in each stage inverts an initial rising edge of a signal generated by the control circuit subsequent to a reset.

In an embodiment, the first, second, and third stages 805, 810, and 815 of ring oscillator 800 oscillate together at a frequency that is proportional to the delay of a signal traversing across stages 851, 852, 853, 854, 855, 856, 857, 858, 859, 860, 861, and 862. The delay is determined from the number of counts (e.g., signal transitions) accumulated by the counters in stages one, two, and three of the ring oscillator. For example, a first number of counts accumulated in a period of time by one or more of the counters that is relatively large, for example, represents a core fabric that has a relatively small aging characteristic. A second number of counts accumulated in the period of time by one or more of the counters that is less than the first number of counts represents a core fabric that has a relatively larger aging characteristic. The accumulated counts or information based on the accumulated counts may be stored in the timing model for use by the EDA toolchain as described above. The timing information described in this patent may include the accumulated counts or may be based on the accumulated counts. Historically accumulated counts through prior aging measurements may also be used to normalize the timing information as the core fabric ages over time.

Most of the signal delay in the ring oscillator comes from signals traversing wires 853, 854, 857, 858, 861, and 862. Because most of the signal delay comes from wires 853, 854, 857, 858, 861, and 862, these wires are the resources under test. Wires 853, 854, 857, 858, 861, and 862 are shown in FIG. 8 as dashed lines to clearly indicate the resources under test. The wires under test (e.g., wires 853, 854, 857, 858, 861, and 862) in the core fabric may include the global horizontal wires (sometimes referred to as H wires), the global vertical wires (sometimes referred to as V wires), and the non-segmented wires (sometimes referred to as LL wires). Delay is determined from the number of counts (e.g., signal transitions) accumulated by the counters in stages one, two, and three of the ring oscillator.

Figure 9:
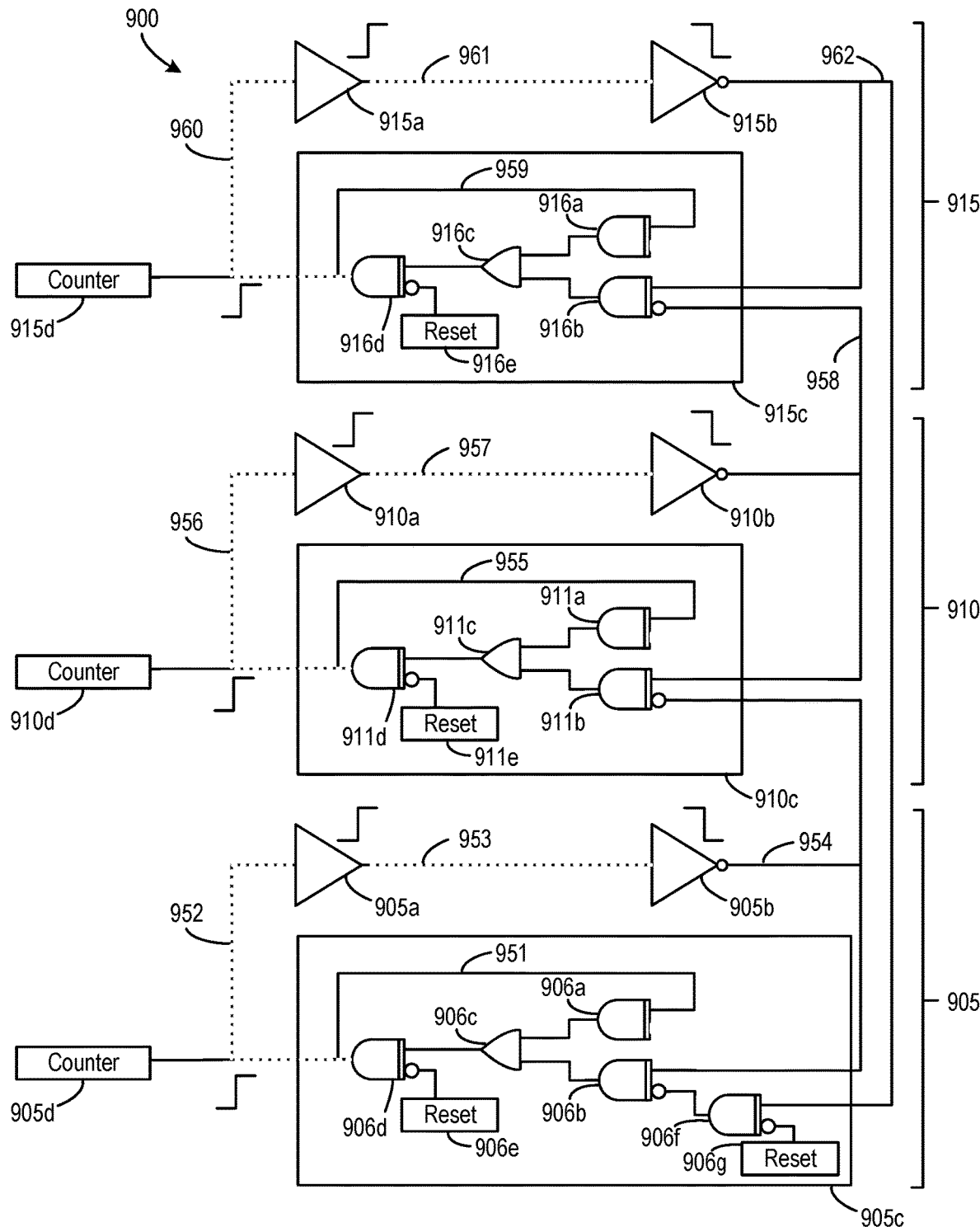
FIG. 9 illustrates an AMC that includes a ring oscillator, in an alternative embodiment.

FIG. 9 illustrates an AMC 900, in an embodiment. AMC 900 is an example AMC that may be any one of the described AMCs in this patent, such as any of AMCs 65a . . . 65n, any of AMCs 475a . . . 475n, or other described AMCs. AMC 900 is a ring oscillator that includes an odd number of inverters (e.g., NOT gates). AMC 900 is similar to AMC 800 but differs in the that AMC 900 is a "rise" measurement circuit as the first inverter in each stage follows the buffer of each stage and inverts an initial falling edge of a signal generated by the control circuit subsequent to a reset. The order of the inverters and buffers of the stages of AMC 900 is described further below.

Similar to AMC 800, AMC 900 may be located in adjacent ALEs, which may be located in one or more LABs. In an embodiment where the ALEs are located in one LAB, the AMC is adapted to measure signal delay (e.g., a timing characteristic associated with an aging characteristic) from local circuits of the LAB, local routing wires of the LAB, and other LAB timing characteristics. In an embodiment where the ALEs are located in more than one LAB, the AMC is adapted to measure a global-signal routing-delay characteristic. The global-signal routing-delay characteristic includes cumulative routing delay characteristics within each LAB and cumulative routing delay characteristics between the LABs.

In an embodiment, AMC 900 includes a first stage 905, a second stage 910, and a third stage 915. The first stage includes a buffer 905a, an inverter 905b, a control circuit 905c, and a counter (e.g., a shift register) 905d. The buffer 905a, inverter 905b, and control circuit 905c are arranged in a loop. The buffer is the head of the loop, the inverter is the tail of the loop, and the control circuit is the control of the loop.

In an embodiment, the control circuit 905c of the first stage includes an AND gate 906a, an AND gate 906b having a non-inverted input and one inverted input, an OR gate 906c, an AND gate 906d having a non-inverted input and an inverted input, which is connected to a reset circuit 906e, and an AND gate 906f having a non-inverted input and an inverted input, which is connected to a reset circuit 906g. An output of AND gate 906d feeds back into a first input of AND gate 906a. In an embodiment, a second input of AND gate 906a may be a fixed level input, e.g., 1 or 0. A first input (the non-inverted input) of AND gate 906b is connected to an output of inverter 905b. A second input (the inverted input) of AND gate 906b is connected to the output of AND gate 906f. A first input (the non-inverted input) of AND gate 906f is connected to the output of inverter 915b. A second input (the inverted input) of AND gate 906f is connected to reset 906g. The outputs of both AND gates 906a and 906b are connected to first and second inputs of OR gate 906c. The output of OR gate 906c is connected to a first input (the non-inverted input) of AND gate 906d. The reset 906e is connected to a second input (the inverted input) of AND gate 906d. An output of AND gate 906d is connected to both the input of counter 905d and the input of buffer 905a. An output of buffer 905a is connected to an input of inverter 905b. Counter 905d is adapted to accumulate (i.e., count) the signal transitions of stage one 905. The counter may count high-to-low signal transitions, low-to-high signal transitions, or both.

The second stage 910 includes a buffer 910a, an inverter 910b, a control circuit 910c, and a counter (e.g., a shift register) 910d. The buffer 910a, inverter 910b, and control circuit 910c are arranged in a loop. The buffer is the head of the loop, the inverter is the tail of the loop, and the control circuit is the control of the loop.

In an embodiment, the control circuit 910c of the second stage includes an AND gate 911a, an AND gate 911b having a non-inverted input and an inverted input, an OR gate 911c, and an AND gate 911d having a non-inverted input and an inverted input, which is connected to a reset circuit 911e. An output of AND gate 911d feeds back into a first input of AND gate 911a. In an embodiment, a second input of AND gate 911a may be a fixed level input, e.g., 1 or 0. A first input (the non-inverted input) of AND gate 911b is connected to an output of inverter 910b. A second input (the inverted input) of AND gate 911b is connected to the output of inverter 905b of the first stage. The outputs of both AND gates 911a and 911b are connected to first and second inputs of OR gate 911c. The output of OR gate 911c is connected to a first input (the non-inverted input) of AND gate 911d. The reset 911e is connected to a second input (the inverted input) of AND gate 911d. An output of AND gate 911d is connected to both the input of counter 910d and the input of buffer 910a. An output of buffer 910a is connected to an input of inverter 910b. Counter 910d is adapted to accumulate (i.e., count) the signal transitions of stage two 910. The counter may count high-to-low signal transitions, low-to-high signal transitions, or both.

The third stage 915 includes a buffer 915a, an inverter 915b, a control circuit 915c, and a counter (e.g., a shift register) 915d. The buffer 915a, inverter 915b, and control circuit 915c are arranged in a loop. The buffer is the head of the loop, the inverter is the tail of the loop, and the control circuit is the control of the loop.

In an embodiment, the control circuit 915c of the third stage includes an AND gate 916a, an AND gate 916b having a non-inverted input and an inverted input, an OR gate 916c, and an AND gate 916d having a non-inverted input and an inverted input, which is connected to a reset circuit 916e. An output of AND gate 916d feeds back into a first input of AND gate 916a. In an embodiment, a second input of AND gate 916a may be at a fixed level input, e.g., 1 or 0. A first input (the non-inverted input) of AND gate 916b is connected to an output of inverter 915b. A second input (the inverted input) of AND gate 916b is connected to the output of inverter 910b of the second stage. Outputs of both AND gates 916a and 916b are connected to first and second inputs of OR gate 916c. An output of OR gate 916c is connected to a first input (the non-inverted input) of AND gate 916d. The reset 916e is connected to a second input (the inverted input) of AND gate 916d. The output of AND gate 916d is connected to both the input of counter 915d and the input of buffer 915a. An output of buffer 915a is connected to an input of inverter 915b. Counter 915d is adapted to accumulate (i.e., count) the transitions of stage three 915. The counter may count high-to-low signal transitions, low-to-high signal transitions, or both. Reset 916e is adapted to reset the first stage of the ring oscillator.

In an embodiment, the first, second, and third stages 905, 910, and 915 of ring oscillator 900 oscillate together at a frequency that is proportional to the delay of a signal traversing from stages 951, 952, 953, 954, 955, 956, 957, 959, 959, 960, 961, and 962. Delay is determined from the number of counts (e.g., signal transitions) accumulated by the counters in stages one, two, and three of the ring oscillator. For example, a first number of counts accumulated in a period of time by one or more of the counters that is relatively large, for example, represents a core fabric that has a relatively small aging characteristic. A second number of counts accumulated in the period of time by one or more of the counters that is less than the first number of counts represents a core fabric that has a relatively larger aging characteristic. The accumulated counts or information based on the accumulated counts may be stored in the timing model for use by the EDA toolchain as described above. The timing information described in this patent may include the accumulated counts or may be based on the accumulated counts.

Most of the signal delay in the ring oscillator comes from wires 952, 953, 956, 957, 960, and 961. Because most of the signal delay comes from wires 952, 953, 956, 957, 960, and 961, these wires are the resources under test. Wires 952, 953, 956, 957, 960, and 961 are shown in FIG. 9 as dashed lines to indicate the resources under test. The wires under test (e.g., wires 952, 953, 956, 957, 960, and 961) in the core fabric may include the global horizontal wires (sometimes referred to as H wires), the global vertical wires (sometimes referred to as V wires), and the non-segmented wires (sometimes referred to as LL wires). Delay is determined from the number of counts (e.g., signal transitions) accumulated by the counters in stages one, two, and three of the ring oscillator.

Figure 10:
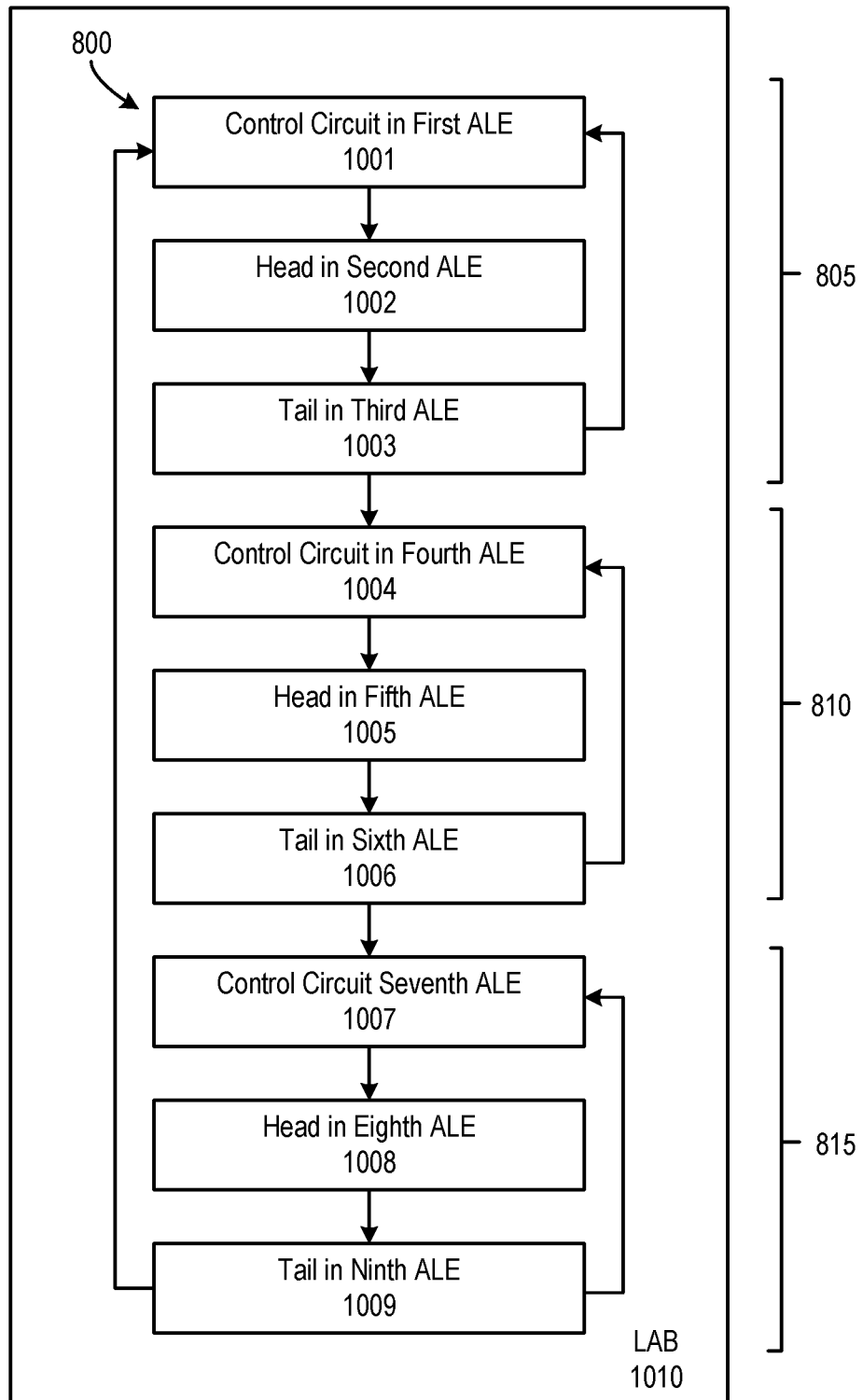
FIG. 10 illustrates an AMC that includes three stages where a head section, a tail section, and a control circuit of each stage are located in one logic array block (LAB), in an embodiment.

FIG. 10 illustrates an AMC, such as AMC 800, in an embodiment. The illustrated AMC may alternatively be AMC 900. The head, tail, and control circuit of each of the stages 805, 810, and 815 are shown in FIG. 10. The counters of the stages are not shown in FIG. 10. In an alternative embodiment, the stages are stages 905, 910, and 915. Each head, tail, and control circuit is in a different ALE. The control circuit, head, and tail of stage 805 are, respectively, in a first ALE 1001, a second ALE 1002, and a third ALE 1003. The control circuit, head, and tail of stage 810 are, respectively, in a fourth ALE 1004, a fifth ALE 1005, and a sixth ALE 1006. The control circuit, head, and tail of stage 815 are, respectively, in a seventh ALE 1007, an eighth ALE 1008, and a ninth ALE 1009. The first, second, and third stages (e.g., ALEs 1001-1009) may be in one LAB 1010. The ALEs are connected by the lab-lines (e.g., wires) of the LAB.

Figure 11:
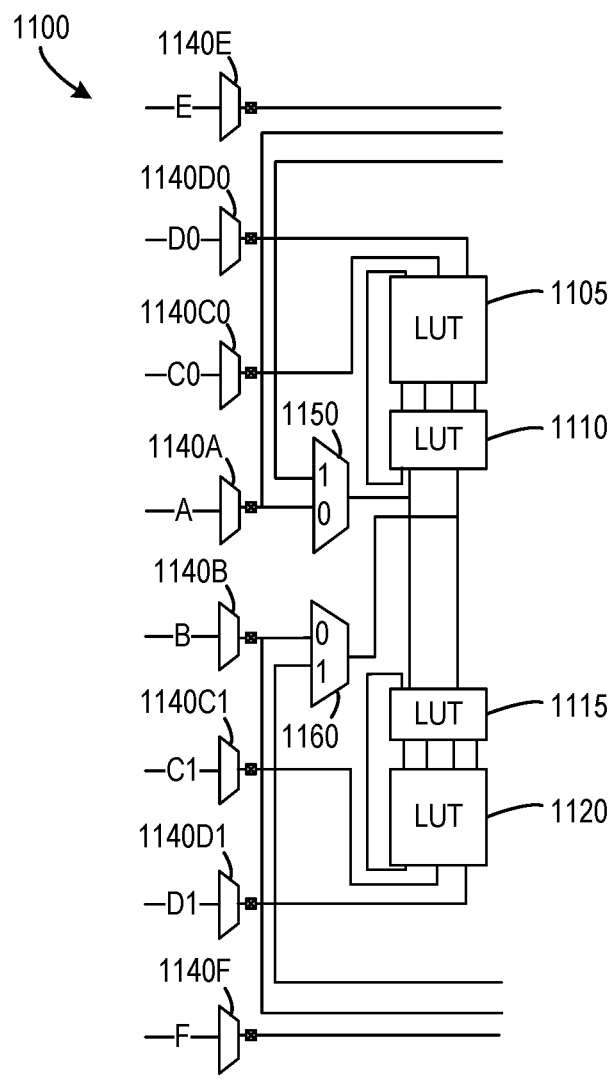
FIG. 11 illustrates an adaptive logic module, in an embodiment.

FIG. 11 illustrates a portion of an adaptive logic module (ALM) 1100, in an embodiment. The portion of ALM 1100 illustrated in FIG. 11 shows the fracturable look-up tables (LUTs) 1105, 1110, 1120, 1125 of the ALM. Other portions of the ALM are not illustrated, such as carry-chain logic structures, flip-flop structures, and other structures. A LAB row of a configurable IC die may include one or more ALMs, such as 10 ALMs. Each ALM may include four fracturable LUTs, such as fracturable LUTs 1105, 1110, 1120, 1125. Other ALM embodiments may include more or fewer fracturable LUTs. A fracturable LUT may be divided into other smaller LUTs, such as two smaller LUTs. The smaller LUTs are sometimes referred to as adaptive LUTs (ALUTs).

Each ALM includes a number of inputs, such as eight inputs. In FIG. 11 the inputs are labeled E, D0, C0, A, B, C1, D1, and F. The inputs connect, respectively, to logic element input multiplexer (LEIM) input drivers 1140E, 1140D0, 1140C0, 1140A, 1140B, 1140C1, 1140D1, and 1140F Inputs A and B that connect to multiplexers 1150 and 1160 of the ALM, may be inputs having a relatively high delay compared to the other inputs and input A may have a higher delay than input B.

The aging characteristics determined by the AMC include aging characteristics for the circuit elements of the LAB and the lab-lines of the LAB. In one embodiment, each stage 805, 810, and 815 are adapted to use input A. The use of input A for each stage may facilitate an approximate maximize signal delay through the LAB. The AMC is enabled to oscillate for a known period of time. The known period of time of the oscillation may be controlled by a timing circuit, such as a branch of a timing tree, a processor, or another circuit. The signal delay measured for the known period of time facilitates a measure of an aging characteristic. Timing information (e.g., counts counted by the counters or a derivative of the counts) for the aging characteristic may be stored in the timing model and the timing model may be used by the EDA toolchain for mapping and fitting the circuit in the core fabric, generating timing guard-bands, or other uses.

Figure 12:
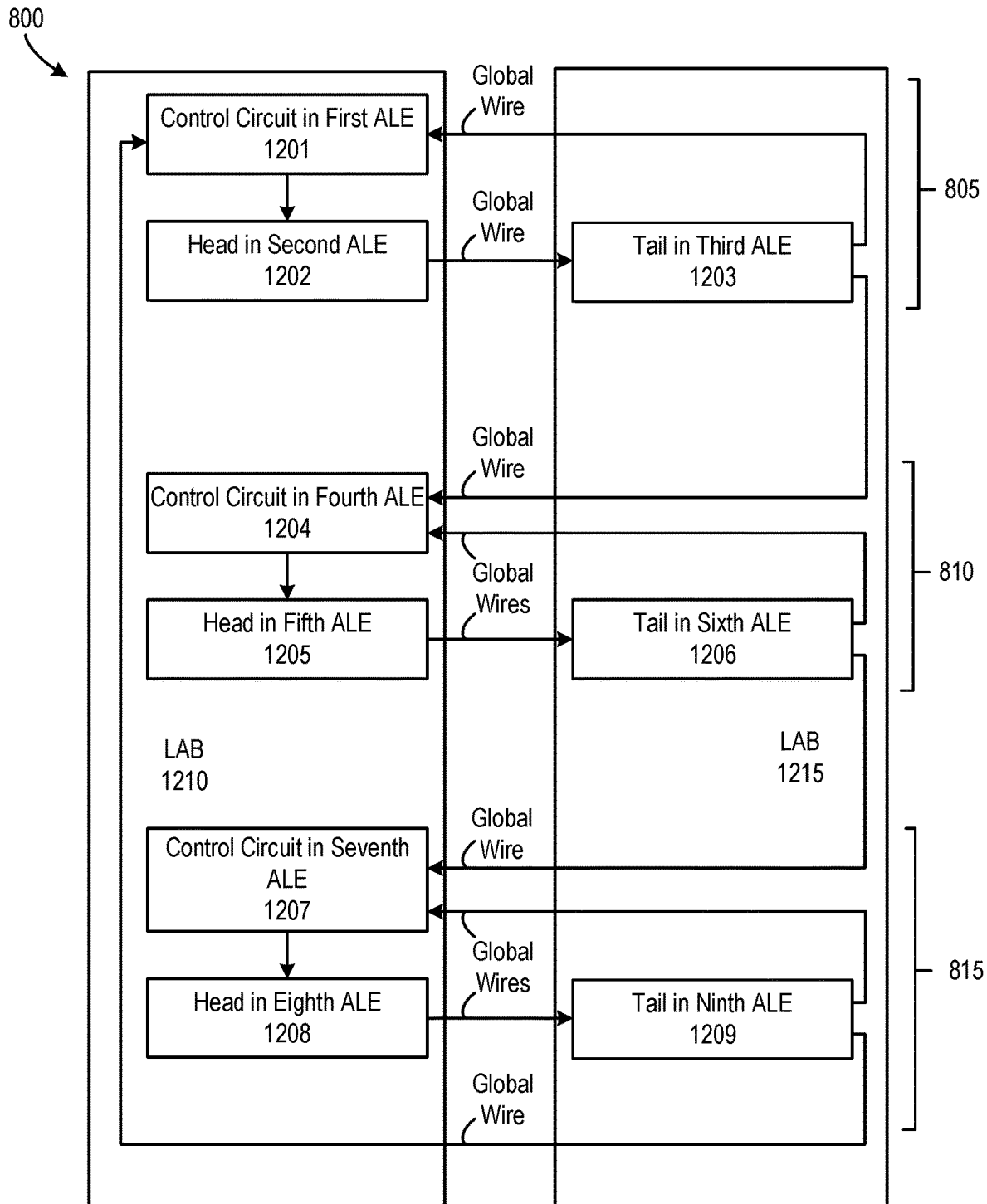
FIG. 12 illustrates an AMC that includes three stages where at least one portion of each stage is located in a first LAB and another portion of each stage is located in a second LAB, in an embodiment.

FIG. 12 illustrates an AMC, such as AMC 800, in an embodiment. The AMC illustrated in FIG. 12 may alternatively be AMC 900. The head and control circuit of each of the stages 805, 810, and 815 are shown in FIG. 12. The counters of the stages are not shown in FIG. 12. In an alternative embodiment, the stages are stages 905, 910, and 915. Each head, tail, and control circuit is in a different ALE. The control circuit, head, and tail of stage 805 are, respectively, in a first ALE 1201, a second ALE 1202, and a third ALE 1203. The control circuit, head, and tail of stage 810 are, respectively, in a fourth ALE 1204, a fifth ALE 1205, and a sixth ALE 1206. The control circuit, head, and tail of stage 815 are, respectively, in a seventh ALE 1207, an eighth ALE 1208, and a ninth ALE 1209. The control circuit and head of each stage are located in a first LAB 1210 and the tail of each stage is located in a second LAB 1215. The first and second LABs may be connected by horizontal global wires, vertical global wires, or a combination of horizontal and vertical global wires. Global wires interconnect the LABs in a core fabric. The timing information for aging characteristic, which is determined by operation of the AMC being located in two LABs, includes aging characteristic of elements (e.g., circuit, wires, or other elements) of the first and second LABs and the global wires that connect the LABs.

In one embodiment, to facilitate measurement of aging characteristics of the horizontal global wires (i.e., H wires), the first and second labs may be horizontally displaced with respect to each other in the core fabric. For example, the first LAB may be located at the LAB coordinates LAB(x,y) and the second LAB may be placed at the LAB coordinates LAB(x+n,y). The value of n may be any value representing a distance between LABs, such as 40 or another value. In one embodiment, to facilitate measurement of aging characteristics of the vertical global wires (i.e., V wires), the first and second labs may be vertically displaced with respect to each other in the core fabric. For example, the first LAB may be located at the LAB coordinates LAB(x,y) and the second LAB may be placed at the LAB coordinates LAB(x,y+n). The value of n may be any value representing a distance between LABs, such as 40 or another value.

While the foregoing describes the use of AMCs that are ring oscillators for determining timing information for an aging characteristic of a configurable IC die, another circuit may be used for determining the timing information. For example, an AMC may include a linear inverter chain that may be located in one or more LABs for determining timing information for an aging characteristic. The timing information may be for wires in the LAB or one or more global wires that connect two or more LABs. In one embodiment, the AMC is a latch circuit that is adapted to measure timing information for an aging characteristic of a configurable IC die.

Figure 13:
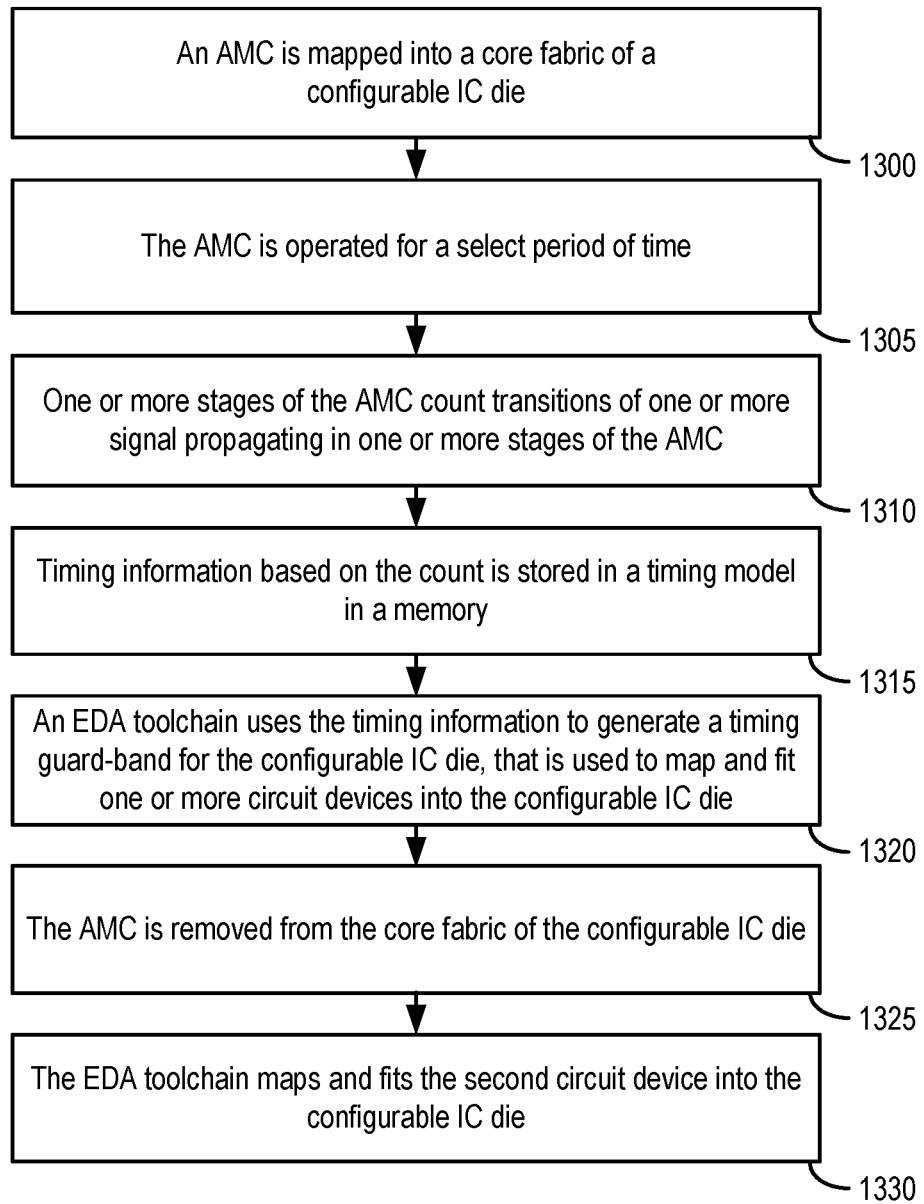
FIG. 13 is a flow diagram of a method for generating timing information for an aging characteristic of a configurable IC die, in an embodiment.

FIG. 13 is a flow diagram of a method for generating timing information for an aging characteristic of a configurable IC die. The flow diagram represents one example embodiment. Steps may be added to, removed from, or combined in the flow diagram without deviating from the scope of the embodiment.

At 1300, an AMC is mapped into a core fabric of a configurable IC die. The AMC may be mapped into the core fabric during a time when a host system that the configurable IC die is installed in, is temporarily not it in use, such as during scheduled maintenance of the host, during a switch from using a first circuit device in the configurable IC die to mapping a second circuit device into the configurable IC die. The AMC may be a ring oscillator and may be mapped into one or more LABs.

At 1305, the AMC is operated for a select period of time.

At 1310, one or more stages of the AMC count signal transitions of one or more signal propagating through the one or more stages of the AMC. The transitions may be high-to-low transitions, low-to-high transitions, or both high-to-low and low-to-high transitions of the signal propagating through the one or more stages.

At 1315, timing information based on the count is stored in a timing model in a memory. The timing information may represent timing delays from a signal wire in a LAB, from a horizontal wire that connects two or more LABS, from a vertical wire that connects two or more LABs, or any combination of these wires.

At 1320, an EDA toolchain uses the timing information to generate a timing guard-band for the configurable IC die, that is used to map and fit one or more circuit devices into the configurable IC die. The signal propagating through the AMC may propagate in one LAB or between two or more LABS. In an embodiment where the signal propagates in one LAB, the propagation of the signal over the select period of time indicates an aging characteristic of circuits and wires of the LAB. In an embodiment where the signal propagates in two or more LABs, the propagation of the signal over the select period of time indicates an aging characteristic of circuits and wires of the LABs and wires that connect the LABs. The wires connecting the LABs may be horizontal wires, vertical wires, or both horizontal and vertical wires.

At 1325, the AMC is removed from the core fabric of the configurable IC die.

At 1330, the EDA toolchain maps and fits the second circuit device into the configurable IC die. The method may be repeated before another circuit device (e.g., a third circuit device) is scheduled to be mapped and fitted into the core fabric.

In one embodiment, the AMCs mapped into the core fabric at 1300 may be operated in combination with one or more hardened AMCs that are not located in the core fabric. The timing information may include timing information for the AMC in the core fabric and the hardened AMC. The timing information may be used by the EDA toolchain as described at 1330 and 1335.

Figure 14:
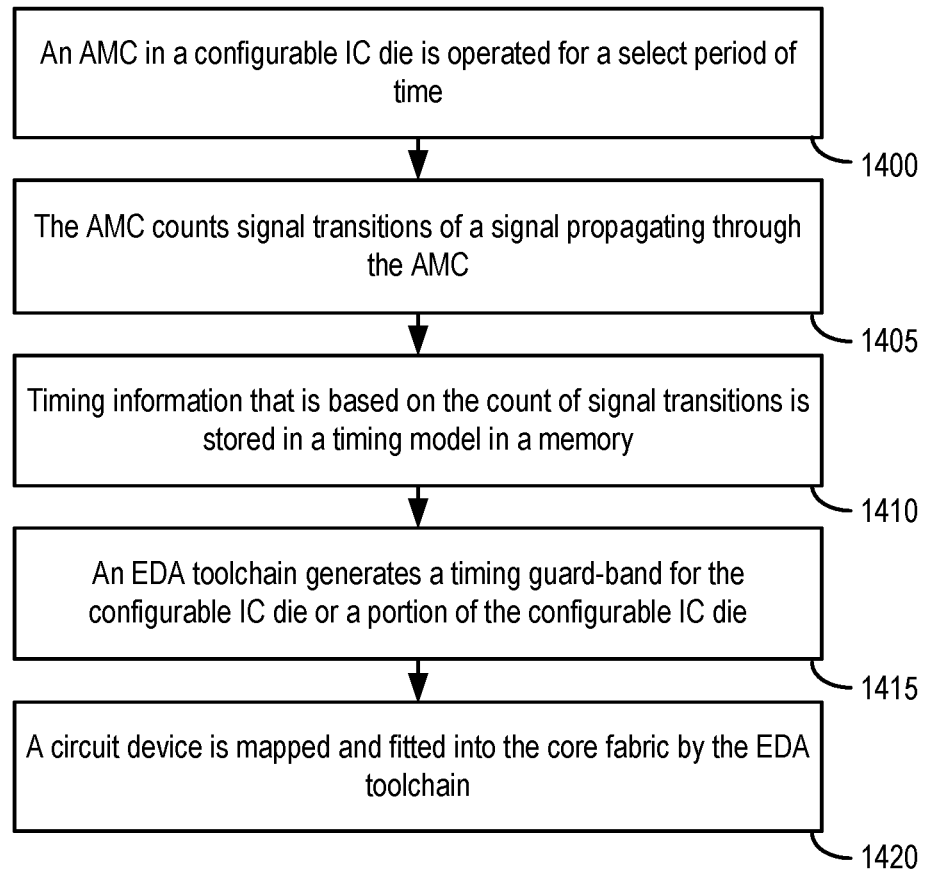
FIG. 14 is a flow diagram of a method for generating timing information for an aging characteristic of a configurable IC die, in an alternative embodiment.

FIG. 14 is a flow diagram of a method for generating timing information for an aging characteristic of a configurable IC die. The flow diagram represents one example embodiment. Steps may be added to, removed from, or combined in the flow diagram without deviating from the scope of the embodiment.

At 1400, an AMC in a configurable IC die is operated for a select period of time. The AMC may be a soft AMC in the core fabric or a hardened AMC. In an embodiment, both soft and hardened AMCs are operated at 1400.

At 1405, the AMC counts signal transitions of a signal propagating through the AMC. Signal transitions may be high-to-low transitions, low-to-high transitions, or both high-to-low and low-to-high transitions of the signal propagating through the one or more stages. The signal propagating through the AMC may propagate in one LAB or between two or more LABS. In an embodiment where the signal propagates in one LAB, the propagation of the signal over the select period of time indicates an aging characteristic of circuits and wires of the LAB. In an embodiment where the signal propagates in two or more LABs, the propagation of the signal over the select period of time indicates an aging characteristic of circuits and wires of the LABs and wires that connect the LABs. The wires connecting the LABs may be horizontal wires, vertical wires, or both horizontal and vertical wires. If one or more AMCs are operated on the configurable IC die, then each AMC may accumulate counts for signal transitions of signals propagating through the AMCs.

At 1410, timing information that is based on the count of signal transitions is stored in a timing model in a memory. In an embodiment, the timing information includes the number of counts.

At 1415, an EDA toolchain generates a timing guard-band for the configurable IC die, a portion of the configurable IC die, uses the guard-bands to map and fit one or more circuit devices into the configurable IC die, one of these elements, or any combination of these elements. The portion of the configurable IC die may include a portion of the core fabric of the configurable IC die. The portion of the core fabric is smaller than the entire core fabric.

At 1420, a circuit device is mapped and fitted into the core fabric by the EDA toolchain. Thereafter, the circuit device may be operated according to the timing guard-band.

Figure 15:
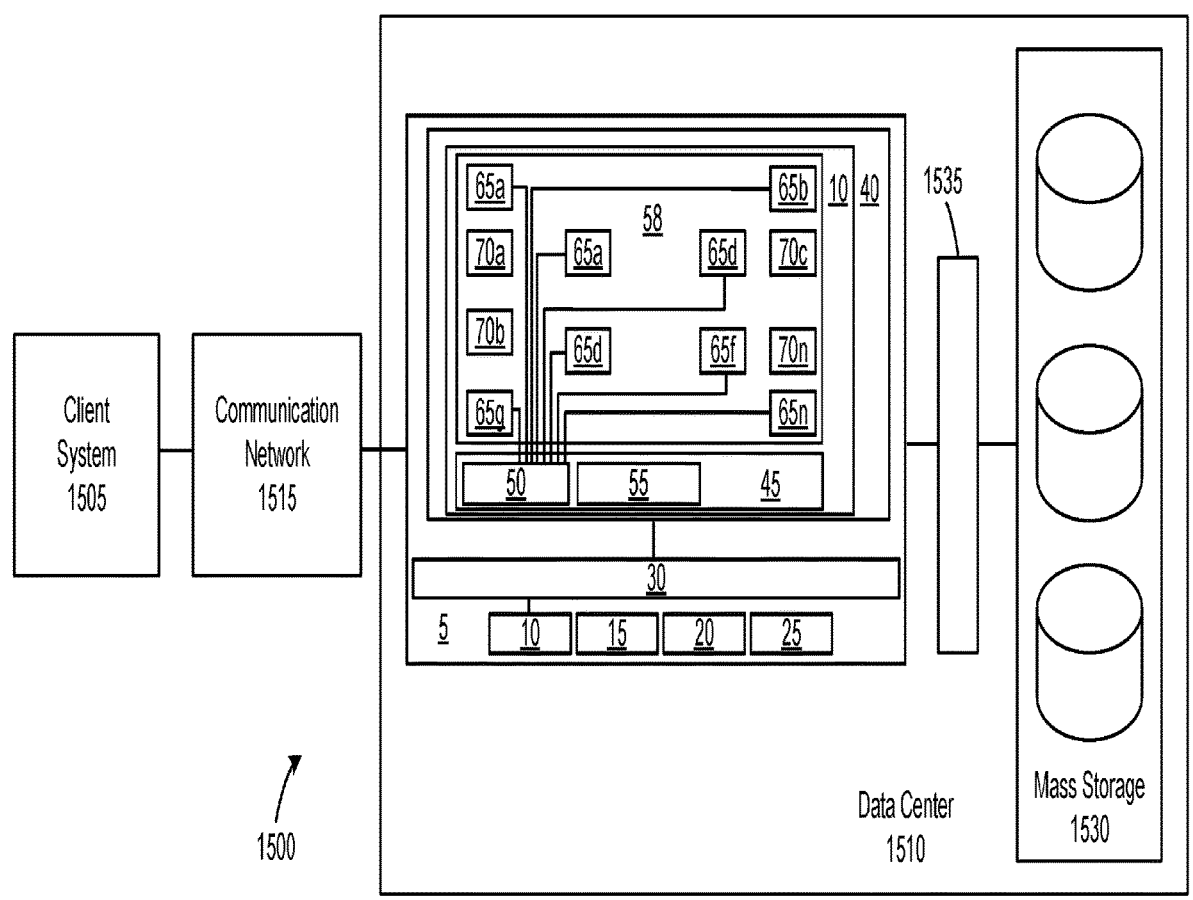
FIG. 15 illustrates a data system, in an embodiment.

FIG. 15 illustrates a data system 1500, in an embodiment. Data system 1500 includes a client system 1505 that is adapted to access a data center 1510 using a communication network 1515. The client system 1505 may include one or more client computers that are adapted to access data stored in the data center. The client computer may include a server, a desktop computer, a laptop computer, a mobile device (e.g., a tablet computer, a smartphone, or other devices), any combination of these devices, or other devices. The client computer may transfer data to the data center for storage in the data center, retrieve data from the data center, or request the alteration of data in the data center. Communication network 1515 may include one or more networks, such as the Internet, one or more intranets, or other network systems.

Data center 1510 includes host 5 (i.e., server), mass storage 1530, an IP switch 1535, and may include other elements. While FIG. 15 shows that the data center includes server 5, the data center may include any of the servers described, such as server 305, 405, 505, or 705. Further, a server in the data center may include any of the configurable IC dies described above and shown in the figures, such as FIGS. 1, 2, 3, 4, 5, and 7. The configurable IC dies in the data center may operate according to any of the methods described and illustrated, such as the methods illustrated in FIGS. 13, 14, 17, and 18.

Mass storage 1530 includes one or more types of memory devices, such as a disk array that includes several disk memory devices (e.g., magnetic disk memory), optical storage (e.g., optical disk storage), solid state memory, tape memory, and others. The memory devices may be located in one or more data center racks, which include one or more of the servers, the IP switch, both, or do not include the servers and the IP switch. The IP switch routes communication packets between the servers and the memory devices of the mass storage.

One or more processing cores 10 of the server may communicate with the memory subsystem at a single data rate (SDR), double data rate (DDR), or quad data rate (QDR) in half or full duplex mode. The memory subsystem may include DDR non-volatile memory, 3D xPoint non-volatile memory, or other types of memory.

The server may be an aggregated server or a disaggregated server. Various component of the server may be located on a single sled in a data center rack, are distributed among two or more sleds in a data center rack, or are distributed among a number of sleds in a number of data center racks. Distributing components of a server among sleds, data center racks, or both may facilitate relatively fast communication between the components by positioning select components in frequent communication relatively close to each other. For example, in a server where the processor accesses the memory subsystem more frequency than the configurable IC die (e.g., FPGA), the processor and memory subsystem may be located relatively close (e.g., on a first sled) in a data center rack and the configurable IC die may be located farther from the memory subsystem (e.g., on a different second sled) in the data center rack. Alternatively, the second sled may be positioned nearer the mass storage than the first sled, for example, if the configurable IC die accesses the mass storage with a higher frequency than the processor.

Figure 16:
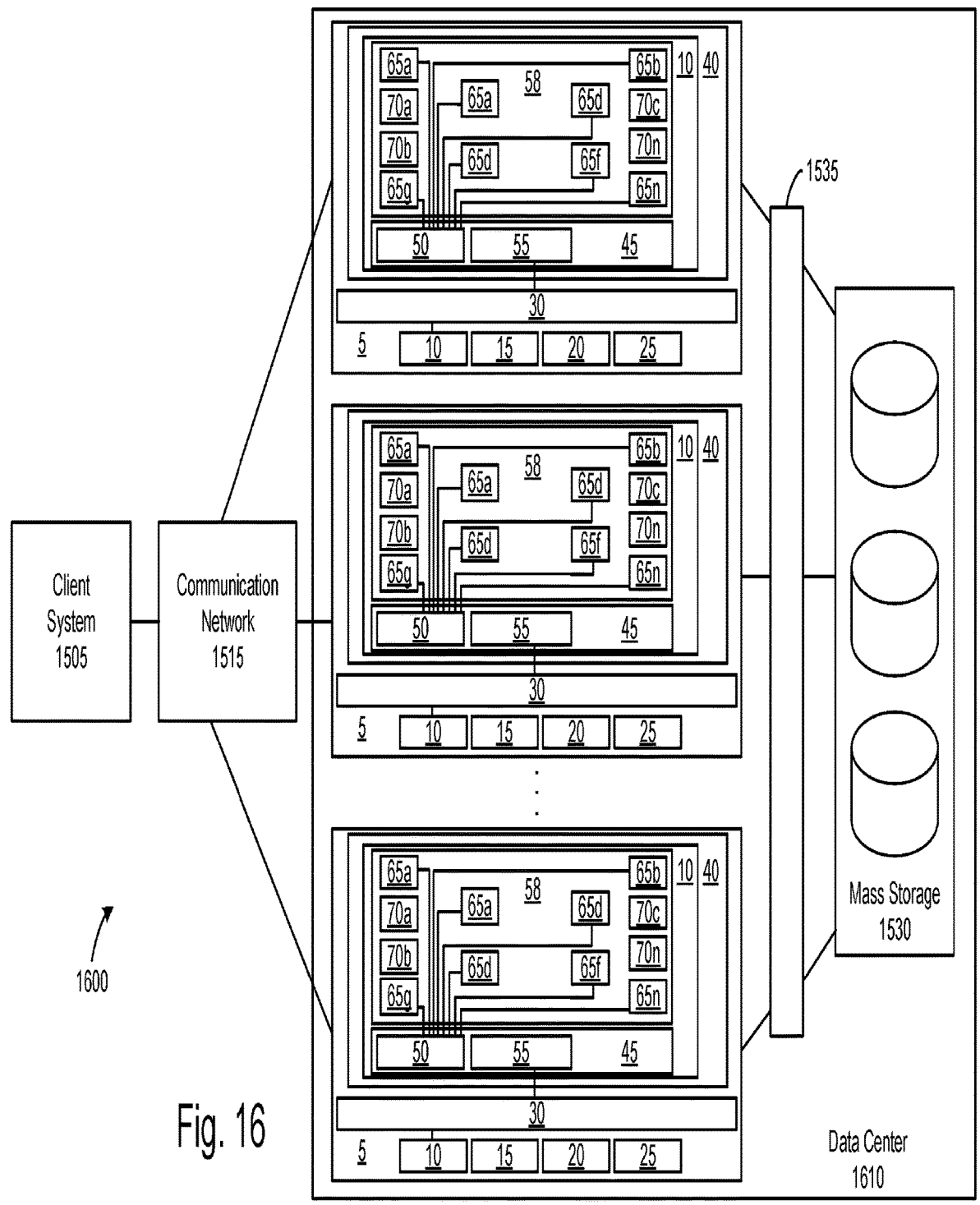
FIG. 16 illustrates a data system, in an alternative embodiment.

FIG. 16 illustrates a data system 1600, in an embodiment. Data system 1600 is similar to data center 1600, but includes a data center 1610 that includes a number of hosts 5 (i.e., servers). While FIG. 15 shows that the data center includes servers 5, the data center may include any of the servers described, such as servers 305, 405, 505, or 705. Further, a server in the data center may include any of the configurable IC dies describe above and shown in the figures, such as FIGS. 1, 2, 3, 4, 5, and 7. The configurable IC dies in the data center may operate according to any of the methods described and illustrated, such as the methods illustrated in FIGS. 13, 14, 17, and 18.

Figure 17:
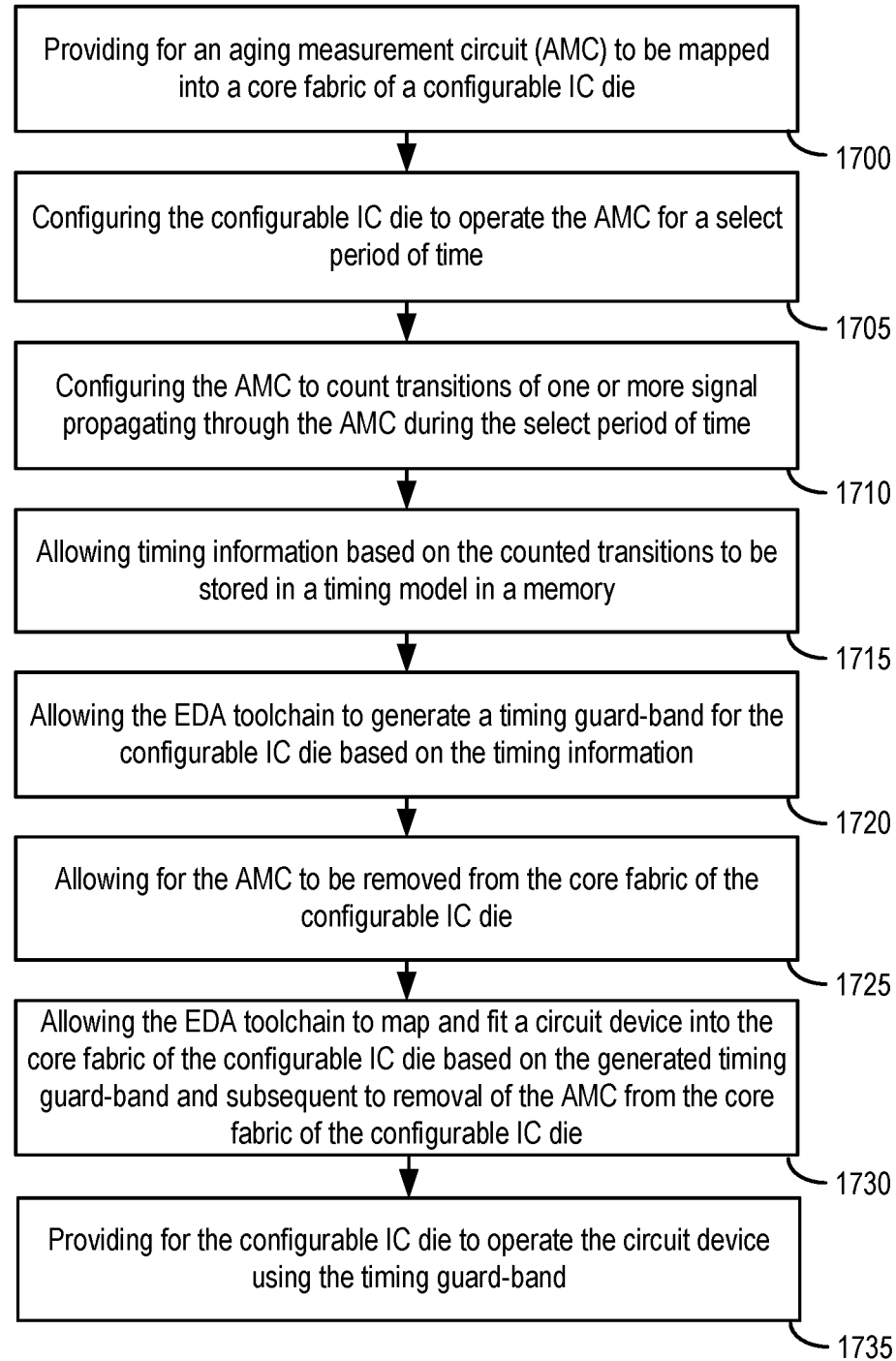
FIG. 17 is a flow diagram of a method for generating timing information for an aging characteristic of a configurable IC die, in an embodiment.

FIG. 17 is a flow diagram of a method for generating timing information for an aging characteristic of a configurable IC die. The flow diagram represents one example embodiment. Steps may be added to, removed from, or combined in the flow diagram without deviating from the scope of the embodiment.

At 1700, the method includes providing for an aging AMC to be mapped into a core fabric of a configurable IC die.

At 1705, the method includes configuring the configurable IC die to operate the AMC for a select period of time.

At 1710, the method includes configuring the AMC to count transitions of one or more signal propagating through the AMC during the select period of time.

At 1715, the method includes allowing timing information based on the counted transitions to be stored in a timing model in a memory. The timing model is a timing model for an EDA toolchain.

At 1720, the method includes allowing the EDA toolchain to generate a timing guard-band for the configurable IC die based on the timing information.

At 1725, the method includes allowing for the AMC to be removed from the core fabric of the configurable IC die.

At 1730, the method includes allowing the EDA toolchain to map and fit a circuit device into the core fabric of the configurable IC die based on the generated timing guard-band and subsequent to removal of the AMC from the core fabric of the configurable IC die.

At 1735, the method includes providing for the configurable IC die to operate the circuit device using the timing guard-band.

The method may include allowing the AMC to be mapped and fitted into the core fabric to include allowing the AMC to be mapped into a single LAB of the core fabric. The timing information may represent an aging characteristic of wires in the LAB.

The method may include allowing the AMC to be mapped and fitted into the core fabric to include allowing the AMC to be mapped and fitted into two or more LABs of the core fabric. The timing information may represent an aging characteristic of wires connecting the LABs, such as horizontal wires in the core fabric, vertical wires in the core fabric.

The method may include allowing the EDA toolchain to map and fit the circuit device into the core fabric using the generated timing guard-band.

The method may include allowing for the AMC to be mapped and fitted into the core fabric during scheduled maintenance of a host in which the configurable IC die is installed.

The method may include allowing a circuit device to be removed from the core fabric of the configurable IC die prior to allowing the AMC to be mapped and fitted into the core fabric of the configurable IC die. The AMC may be a ring oscillator.

The timing guard-band may be included in a number of guard-bands generated by the EDA toolchain based on the timing information. The timing guard-bands may be different for different portions of the core fabric and the different portions of the core fabric may have different aging characteristics.

In an embodiment, a configurable IC die includes a core fabric that includes a number of LABs. Each LAB includes a number of ALEs. The ALEs are configurable to include an AMC. The ALEs are located in a first LAB of the number of LABs.

The configurable IC die also includes a device manager coupled to the core fabric to operate the AMC for a select period of time. The AMC includes a counter to count transitions of one or more signal propagating through the AMC during the select period of time when the AMC is operating.

The configurable IC die also include an input-output block coupled to the device manager to transfer information into and out from the device manager and to transfer information into and out from the semiconductor device. The device manager is coupled to the input-output block to allow the timing information to be transferred out from the input-output block for storage of the timing information in the timing model in a memory. The timing information is based on the count transitions and is a measure of an aging characteristic of the first LAB at a time that the AMCs are operating in the first LAB. An EDA toolchain is operative on a system to use the timing information to generate a timing guard-band for a circuit device mapped and fitted into one or more of the LABs.

In an embodiment, the AMC is removable from the core fabric prior to the circuit device being mapped and fitted into the one or more LABs.

The aging characteristic may indicate an aging of circuits and wires in the first LAB. The aging characteristic may indicate an amount of oxidation of at least portions of the circuits and wires. The EDA toolchain may be operable on the system to map and fit the circuit device into the core fabric based on the aging characteristic.

The ALEs may be located in the first LAB and a second LAB of the number of LABs and the aging characteristic includes an aging characteristic of wires coupling the first and second LABs. The AMC may be a ring oscillator that includes a first stage, a second stage, and a third stage. Each stage includes a control circuit, a head, and a tail. The head and control circuit of each of the first, second, and third stages are in the first LAB. The tail of each of the first, second, and third stages are in the second lab.

Figure 18:
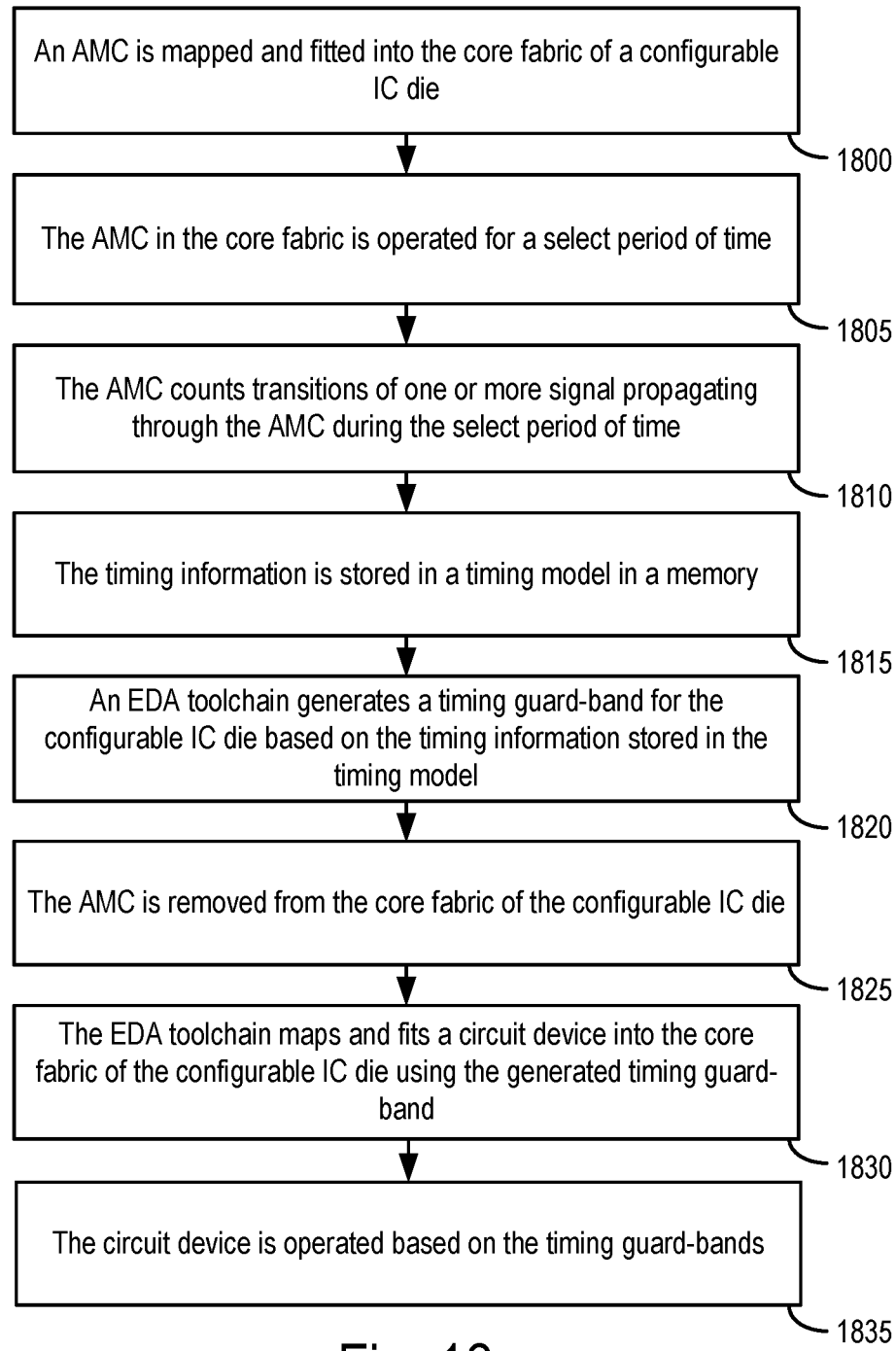
FIG. 18 is a flow diagram of a method for generating timing information for an aging characteristic of a configurable IC die in another embodiment.

FIG. 18 is a flow diagram of a method for generating timing information for an aging characteristic of a configurable IC die. The flow diagram represents one example embodiment. Steps may be added to, removed from, or combined in the flow diagram without deviating from the scope of the embodiment.

At 1800, an AMC is mapped and fitted into the core fabric of a configurable IC die.

At 1805, the AMC in the core fabric is operated for a select period of time.

At 1810, the AMC counts transitions of one or more signal propagating through the AMC during the select period of time.

At 1815, the timing information is stored in a timing model in a memory. The timing information is based on the counting of the transitions and is an aging characteristic of the core fabric at a time that the AMC is operated in the core fabric.

At 1820, an EDA toolchain generates a timing guard-band for the configurable IC die based on the timing information stored in the timing model.

At 1825, the AMC is removed from the core fabric of the configurable IC die.

At 1830, the EDA toolchain maps and fits a circuit device into the core fabric of the configurable IC die using the generated timing guard-band. The mapping and fitting occurs after the removal of the AMC from the core fabric of the configurable IC die.

At 1835, the circuit device is operated based on the timing guard-bands.

The method may further include mapping and fitting the circuit device into the core fabric based on the timing information stored in the timing model. The mapping and fitting may include optimally mapping and fitting by the EDA toolchain the circuit device into the core fabric based on the timing model. The timing guard-band may be included in a number of guard-bands that are generated by the EDA toolchain based on the timing information. The timing guard-bands may be different for different portions of the core fabric and the different portions of the core fabric may have different aging characteristics.

This description has been presented for the purposes of illustration and description. It is not intended to be exhaustive or to limit the invention to the precise form described, and many modifications and variations are possible considering the teaching above. For example, while SiP devices have been described above, embodiments described may be applied to a variety of multi-chip modules, multi-die assemblies, system-on-package devices, and other multi-die devices. The implementations were chosen and described in order to best explain the principles of the embodiments and their practical applications. This description will enable others skilled in the art to best utilize and practice the invention in various implementations and with various modifications as are suited to a particular use. The scope of the invention is defined by the following claims.

The invention claimed is:

1. A method comprising:
mapping an aging measurement circuit (AMC) into a configurable integrated circuit die, the AMC to count transitions of at least one signal propagating through the AMC during a select period of time as counted transitions;
accessing timing information based on the counted transitions;
generating a timing guard-band for the configurable integrated circuit die based on the timing information; and
mapping a circuit device into the configurable integrated circuit die based on the timing guard-band.

2. The method of claim 1 further comprising:
causing the configurable integrated circuit die to operate the circuit device using the timing guard-band.

3. The method of claim 1, wherein the counted transitions are a measure of an aging characteristic of the configurable integrated circuit die.

4. The method of claim 1, wherein the timing guard-band comprises at least one of a limit to a maximum operating frequency or a higher operating voltage of the configurable integrated circuit die.

5. The method of claim 1, wherein the timing information represents an aging characteristic of wires or circuits in the configurable integrated circuit die.

6. The method of claim 1 further comprising:
causing removal of the AMC from the configurable integrated circuit die prior to mapping the circuit device into the configurable integrated circuit die.

7. The method of claim 1, wherein mapping the AMC into the configurable integrated circuit die further comprises mapping the AMC into the configurable integrated circuit die during a scheduled maintenance of a host.

8. The method of claim 1 further comprising:
removing an additional circuit device from the configurable integrated circuit die prior to mapping the circuit device into the configurable integrated circuit die.

9. The method of claim 1, wherein the AMC comprises a ring oscillator.

10. The method of claim 1, wherein the AMC comprises a counter.

11. The method of claim 1, wherein the timing guard-band is in a plurality of timing guard-bands generated by an electronic design automation toolchain based on the timing information, and wherein the timing guard-bands are different for different portions of the configurable integrated circuit die that have different aging characteristics.

12. The method of claim 1, wherein mapping the circuit device into the configurable integrated circuit die further comprises mapping and fitting the circuit device into the configurable integrated circuit die based on the timing guard-band.

13. A method comprising:
mapping an aging measurement circuit (AMC) into a configurable integrated circuit die that counts transitions of a signal through the AMC during a select period of time as counted transitions;
storing timing information that is based on the counted transitions in memory, wherein the timing information indicates an aging characteristic of the configurable integrated circuit die; and
mapping a circuit device into the configurable integrated circuit die using the timing information.

14. The method of claim 13 further comprising:
generating a timing guard-band for the configurable integrated circuit die based on the timing information, wherein mapping the circuit device into the configurable integrated circuit die using the timing information further comprises mapping the circuit device into the configurable integrated circuit die using the timing guard-band.

15. The method of claim 14 further comprising:
causing operation of the circuit device based on the timing guard-band.

16. The method of claim 14 further comprising:
fitting the circuit device into the configurable integrated circuit die using the timing guard-band.

17. The method of claim 13 further comprising:
causing removal of an additional circuit device from the configurable integrated circuit die prior to mapping the circuit device into the configurable integrated circuit die.

18. A method comprising:
mapping an aging measurement circuit (AMC) into a configurable integrated circuit die that counts transitions of a signal as the signal propagates through the AMC during a select period of time as counted transitions;
accessing timing information that is based on the counted transitions, wherein the timing information indicates an aging characteristic of the configurable integrated circuit die;

generating a timing guard-band for the configurable integrated circuit die based on the timing information; and mapping a circuit device into the configurable integrated circuit die based on the timing guard-band.

19. The method of claim 18, wherein the timing guard-band comprises at least one of a limit to a maximum operating frequency or a higher operating voltage of the configurable integrated circuit die.

20. The method of claim 18 further comprising:

causing removal of the AMC from the configurable integrated circuit die prior to mapping the circuit device into the configurable integrated circuit die.

\* \* \* \* \*